(12) United States Patent
Miyawaki et al.

(10) Patent No.: US 7,449,885 B2
(45) Date of Patent: Nov. 11, 2008

(54) MAGNETIC RESONANCE IMAGING METHOD AND APPARATUS

(75) Inventors: Shouichi Miyawaki, Chiba (JP);
Hiroyuki Takeuchi, Chiba (JP);
Yasumasa Saito, Chiba (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 11/975,435

(22) Filed: Oct. 18, 2007

(65) Prior Publication Data

US 2008/0068015 A1    Mar. 20, 2008

Related U.S. Application Data

(63) Continuation of application No. 10/564,249, filed on Jan. 11, 2006, now Pat. No. 7,348,779.

(51) Int. Cl.
*G01V 3/00* (2006.01)

(52) U.S. Cl. .................. 324/307; 324/312; 324/320

(58) Field of Classification Search .............. 324/307, 324/312, 320
See application file for complete search history.

(56) References Cited

U.S. PATENT DOCUMENTS

| 6,043,656 | A  | 3/2000  | Ma et al. |
| 6,392,411 | B1 | 5/2002  | Goto |
| 6,483,305 | B1 | 11/2002 | Miyamoto |
| 6,559,643 | B2 | 5/2003  | Miyoshi |
| 6,867,590 | B2 | 3/2005  | Carlini |
| 2002/0050816 | A1 | 5/2002 | Miyoshi |
| 2002/0135366 | A1 | 9/2002 | Heubes |
| 2003/0160616 | A1 | 8/2003 | Asano et al. |

FOREIGN PATENT DOCUMENTS

| CN | 1285180 A   | 2/2001  |
| JP | 6-245917    | 9/1994  |
| JP | 7-284484    | 10/1995 |
| JP | 2000-157509 | 6/2000  |
| JP | 2000-166898 | 6/2000  |

OTHER PUBLICATIONS

Sep. 7, 2007 Chinese official action (and English translation thereof) in connection with corresponding Chinese application No. 200480020631.4.

*Primary Examiner*—Brij B. Shrivastav
*Assistant Examiner*—Megann E Vaughn
(74) *Attorney, Agent, or Firm*—Cooper & Dunham LLP

(57) ABSTRACT

A magnetic resonance imaging method comprising a step for applying one or more gradient magnetic field pulses continuously, a step for calculating a residual magnetic field being generated from a magnet by an gradient magnetic field pulse based on a residual magnetic field response function representing the relation between the strength of the gradient magnetic field pulse being applied and the strength of a residual magnetic field being generated, and a step for correcting the residual magnetic field thus calculated. The magnetic resonance imaging method is further provided with a step for updating the residual magnetic field response function with time depending on the application history of the gradient magnetic field pulses being applied continuously.

15 Claims, 18 Drawing Sheets

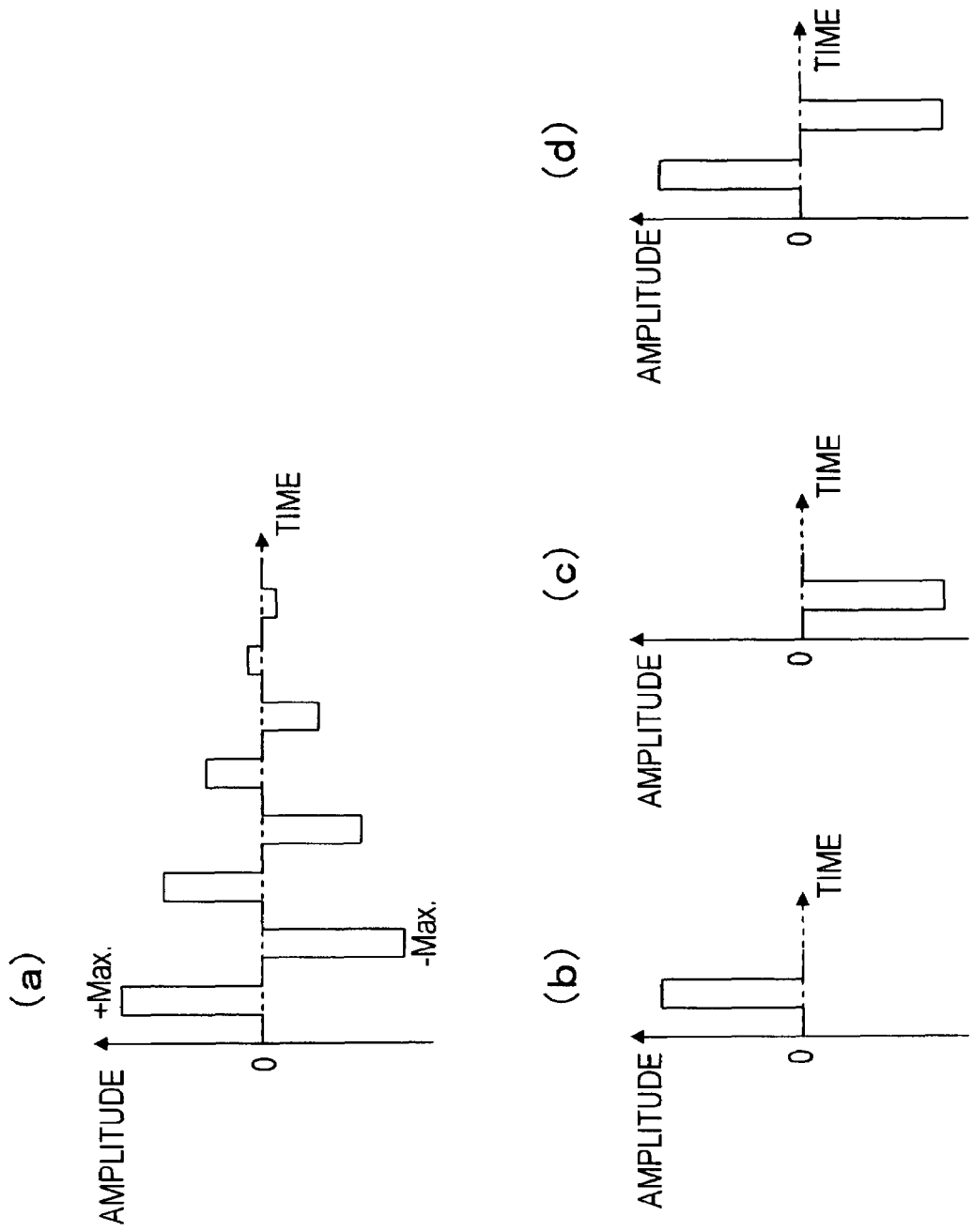

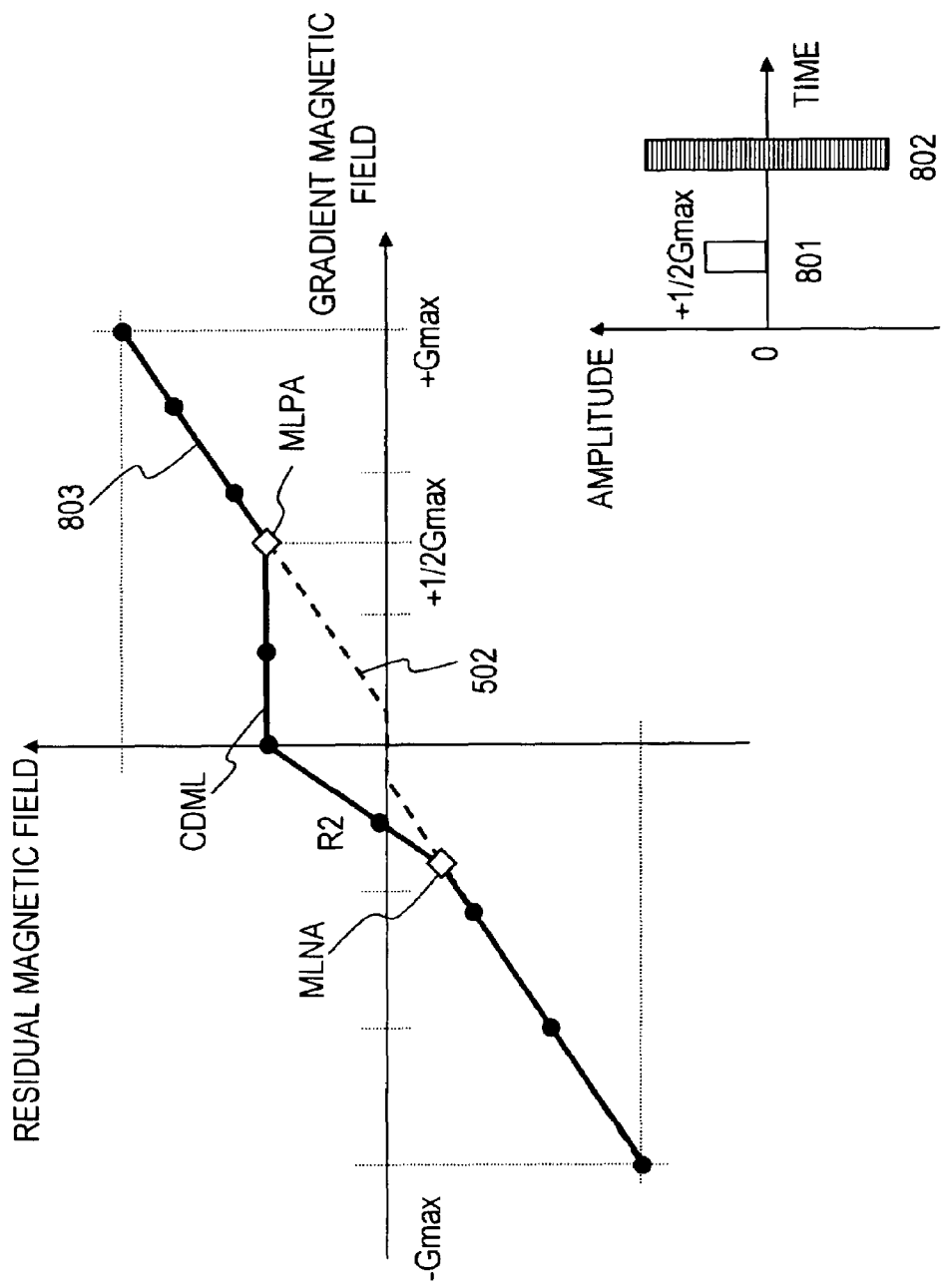

MAGNETIC RESONANCE IMAGING METHOD AND APPARATUS

This application is a continuation of 10/564,249 filed on Jan. 11, 2006, now U.S. Pat. No. 7,348,779, which is incorporated herein by reference in its entirety.

TECHNICAL FIELD

This disclosure relates to a magnetic resonance imaging (hereinafter referred to as MRI) method and apparatus, and in particular to a technique for correcting a residual magnetic field being generated due to the application of a gradient magnetic field in real time, taking into consideration the application history of the gradient magnetic field.

BACKGROUND

An MRI apparatus is designed to obtain magnetic resonance images (hereinafter referred to as MR images) that represent the physical property of a subject, when irradiating electromagnetic waves to a subject placed in an homogeneous static magnetic field, by using the nuclear magnetic resonance phenomena being generated in the nucleus of the atoms that compose the subject, detecting the nuclear magnetic resonance signals (hereinafter referred to as NMR signals) from the subject, and reconstructing the images by these NMR signals. In order to give the positional information of this imaging, a gradient magnetic field is applied being superposed over a static magnetic field.

In an MRI apparatus, when the ferromagnetic materials such as permanent magnets are used as the source of static magnetic field, the residual magnetic field accompanied by hysteresis phenomena is generated by the application of the above-mentioned gradient magnetic field. This residual magnetic field is generated by residual magnification caused by things such as a permanent magnet, being ferromagnetic material. Even when the application of the gradient magnetic field is stopped, the magnetic field with the strength and direction according to its application history still remains. This, along with eddy currents being generated in the structure by the application of the gradient magnetic field, complicates the magnetic field of the imaging space and causes the deterioration of the image quality.

A conventional technique for removing the affect that the residual magnetic field gives to the MRI apparatus is described in Patent Document 1.

Patent Document 1: JP-A-2000-157509

However, even though the conventional technique described in Patent Document 1, in relation to the test gradient magnetic field, obtains a correction quantity of the gradient magnetic field by measuring the residual magnetic field in the form of tables and functions, the application history thereof is not taken into consideration.

SUMMARY

In an aspect of the present invention, an MRI method and apparatus are provided that enable in real time the correction of the residual magnetic field being generated by the application of the gradient magnetic field, taking into consideration the application history of the gradient magnetic field.

In an exemplary embodiment of this disclosure, an MRI method of the present invention includes:

(1) a step for applying one or more pulses of the gradient magnetic field continuously;

(2) a step for calculating the residual magnetic field being generated in the magnetic apparatus by the gradient magnetic field based on the residual magnetic field response function which represents the relation between the strength of the applied gradient magnetic field and the strength of the residual magnetic field being generated by the application of the gradient magnetic field; and (3) a step for correcting the residual magnetic field being calculated as mentioned above, (4) wherein a step for making the residual magnetic field response function used in step (2) depend upon the application history of the gradient magnetic field that applies continuously, and for updating it over time.

According to the above-mentioned present invention, it is possible to correct in real time the residual magnetic field being generated by the application of the gradient magnetic field, taking into consideration the application history of the gradient magnetic field.

Also, according to the preferred embodiment of the present invention, this MRI method includes a step, before the execution of mentioned steps (1)~(4), (5) a step for demagnetizing the residual magnetic field being generated in the mentioned magnetic apparatus, as well as for initializing the residual magnetic field response function to the condition after demagnetization.

According to the above-mentioned embodiment, in the case wherein updating of the residual magnetic field response function used in the step (4) includes errors, since the MRI method is executed using the magnetic apparatus after demagnetizing, it minimizes the errors and makes it possible to perform more precise correction of the residual magnetic field.

Also, according to the preferred embodiment of the MRI method of the present invention, before the execution of steps (1)~(5), (6) a step for obtaining the residual magnetic field response function after degaussing or after the application of one or more pulse of the gradient magnetic field after degaussing, and for storing it as the calibration data is executed.

According to the above-mentioned embodiment, because the basic residual magnetic field response function of the magnetic apparatus can be obtained in advance before the execution of steps (1)~(5), using it as the calibration data, it is possible to update the residual magnetic field response function that is made dependent on the discretional application history.

Moreover, according to the preferred embodiment of the MRI method in the present invention, the correction of the residual magnetic field in step (3) is applied by superposing the correction magnetic field over the gradient magnetic field.

According to the above-mentioned embodiment, the correction of the residual magnetic field can be executed in real time as the residual magnetic field is being generated.

Also, according to the preferred embodiment of the MRI method in the present invention, the superposed and applied correction magnetic field is the gradient magnetic field that has the same axis direction as the previously mentioned gradient magnetic field.

According to the above-mentioned embodiment, it is possible to correct the main components of the generated residual magnetic field.

Moreover, according to the preferred embodiment of the MRI method in the present invention, said superposed and applied residual magnetic field includes other components in addition to the gradient magnetic field that has the same axis direction as the previously mentioned gradient magnetic field.

According to the above-mentioned embodiment, it is possible to correct even the minute components of the generated residual magnetic field.

Also, according to the preferred embodiment of the MRI method in the present invention, the correction of the residual magnetic field by step (3) is executed by varying the strength of the gradient magnetic field for applying to correct the residual magnetic field of previously calculated strength.

According to the above-mentioned embodiment, it is possible to execute the correction of the residual magnetic field with an even simpler apparatus with the existing gradient magnetic field coils.

Also, according to the preferred embodiment of the MRI method in the present invention, the residual magnetic field response function is represented by drawing the residual magnetic field curves on a 2-dimensional chart wherein the X-axis denotes the applied gradient magnetic field and the Y-axis denotes the residual magnetic field being generated by the applied gradient magnetic field.

According to the above-mentioned embodiment, it is easier for the operator to grasp the whole residual magnetic field response function to use for the calculation of the residual magnetic field in step (2).

Also, according the preferred embodiment of the MRI method in the present invention, the updating of the residual magnetic field response function in step (4) includes:

(7) a step for changing the value of Y, in the residual magnetic field curves drawn on the chart and in the range from where the value of X is zero to the strength of the applied gradient magnetic field pulse, to equalize it with the calculated value in step (2); and (8) a step for drawing the residual magnetic field response curve, in the residual magnetic field response curves drawn in the chart and in the opposite direction of the gradient magnetic field pulse being applied from where the value of X is zero, so that the value of Y varies from the calculated value in step (2) with predetermined gradient.

According to the above-mentioned embodiment, it is possible to update the residual magnetic field response curves by step (4) in line with the experiment data.

Also, according to the preferred embodiment of the MRI method in the present invention, it is possible to obtain the predetermined gradient based on the calibration data being stored in step (6).

According to the above-mentioned embodiment, it is possible to further update the residual magnetic field response curves by step (4) in line with the experiment data.

It is possible to achieve the above-mentioned objectives also with the MRI apparatus, and the MRI apparatus of the present invention includes:

a static magnetic field generation means for generating the static magnetic field in the imaging space where the subject is placed;

a gradient magnetic field generation means for applying the gradient magnetic field said imaging space; and a control means for controlling the application of the gradient magnetic field by the gradient magnetic field generation means;

wherein the MRI apparatus comprises the residual magnetic field correction means being connected to the control means, for correcting the residual magnetic field being generated by the application of the gradient magnetic field taking into consideration the application history of the gradient magnetic field.

According to the above-mentioned present invention, it is possible to correct the residual magnetic field being generated by the application of the gradient magnetic field in real time, taking into consideration the application history of the gradient magnetic field.

Also, according to the preferred embodiment of the MRI apparatus in the present invention, the residual magnetic field correction means comprises:

a residual magnetic field correction control means being connected to said control means, for controlling the correction of the residual magnetic field;

a storage means being connected to the residual magnetic field correction control means, for storing the residual magnetic field response function depending on the application history of the gradient magnetic field; and a correction magnetic field generation means being connected to the residual magnetic field correction control means, for applying the correction magnetic field to correct the residual magnetic field based on the residual magnetic field correction controlling signals that are inputted by the residual magnetic field correction control means.

According to the above-mentioned embodiment, it is possible for the respective means to share the function for correcting the residual magnetic field.

Also, according to the preferred embodiment of the MRI apparatus in the present invention, residual magnetic field correction control means controls the correction of the residual magnetic field by:

(9) a step for calculating the strength of the residual magnetic field being generated by the application of the gradient magnetic field based on the residual magnetic field response function being stored in the storage means upon the transmission of the information on the strength of the gradient magnetic field that is to be applied next from the storage means;

(10) a step for calculating the strength of the correction magnetic field for correcting the residual magnetic field of the strength which was calculated as mentioned above;

(11) a step for transmitting the residual magnetic field correction controlling signals for applying the correction magnetic field which was calculated as mentioned above, to the correction magnetic field generation means; and

(12) a step for calculating and updating the variance of the residual magnetic field response function caused by the application of the gradient magnetic field, and for storing the updated residual magnetic field response function to the storage means.

According to the above-mentioned embodiment, the steps on how the residual magnetic field correction control means controls the correction of the residual magnetic field become apparent.

Also, according to the preferred embodiment of the MRI apparatus in the present invention, the correction magnetic field is the gradient magnetic field that has the same axis as said gradient magnetic field.

According to the above-mentioned embodiment, it is possible to correct the main components of the generated residual magnetic field.

Also, according to the preferred embodiment of the MRI apparatus in the present invention, the correction magnetic field that is superposed and applied as previously mentioned includes also components other than the gradient magnetic field that have the same axis as said gradient magnetic field.

According to the above-mentioned embodiment, it is possible to correct even the minute components of the generated residual magnetic field.

Also, according to the preferred embodiment of the MRI apparatus in the present invention, the correction magnetic field generation means is the correction coils.

According to the above-mentioned embodiment, the application for correction magnetic field can be executed accurately.

Also, according to the preferred embodiment of the MRI apparatus in the present invention, the residual magnetic field correction means comprises:

a gradient magnetic field correction control means being connected to the control means, for controlling the application of the gradient magnetic field by correcting the affect of residual magnetic field; and a storage means being connected to the gradient magnetic field correction control means, for storing the residual magnetic field response function depending on the application history of the gradient magnetic field, wherein the gradient magnetic field generation means is connected to the gradient magnetic field correction control means.

According to the above-mentioned embodiment, the correction of the residual magnetic field can be executed with a simpler apparatus using the conventional gradient magnetic field coils.

Also, according to the preferred embodiment of the MRI apparatus in the present invention, the gradient magnetic field correction control means controls the correction of the gradient magnetic field by:

(13) a step for calculating the strength of the residual magnetic field being generated by the application of the gradient magnetic field, on the basis of the residual magnetic field response function stored in the storage means, upon the transmission of the information on the strength of the gradient magnetic field that is to be applied next from the control means;

(14) a step for calculating how much variance is needed for the strength of the gradient magnetic field to be applied for correcting the residual magnetic field of which the strength was calculated previously;

(15) a step for transmitting the gradient magnetic field correction controlling signals for the application of the gradient magnetic field in which the strength was varied previously, to the gradient magnetic field generation means; and

(16) a step for calculating and updating the variance of the residual magnetic field response function by application of the gradient magnetic field, and for storing the updated residual magnetic field response function in the storage means.

According to the above-mentioned embodiment, the steps on how gradient magnetic field correction control means controls the correction of the residual magnetic field becomes apparent.

BRIEF DESCRIPTION OF THE DRAWINGS

FIG. 7 is a diagram showing the embodiment of degaussing pulse (a) and the test gradient magnetic field pulses (b)~(d) are being applied.

FIG. 8 is a diagram showing an RM curve after degaussing upon applying the gradient magnetic field pulse of half the strength of the maximum gradient magnetic field on the positive side.

BEST MODES FOR IMPLEMENTING THE INVENTION

Hereinafter, preferred embodiments of the present invention will be described with reference to the attached drawings.

Figure 1:
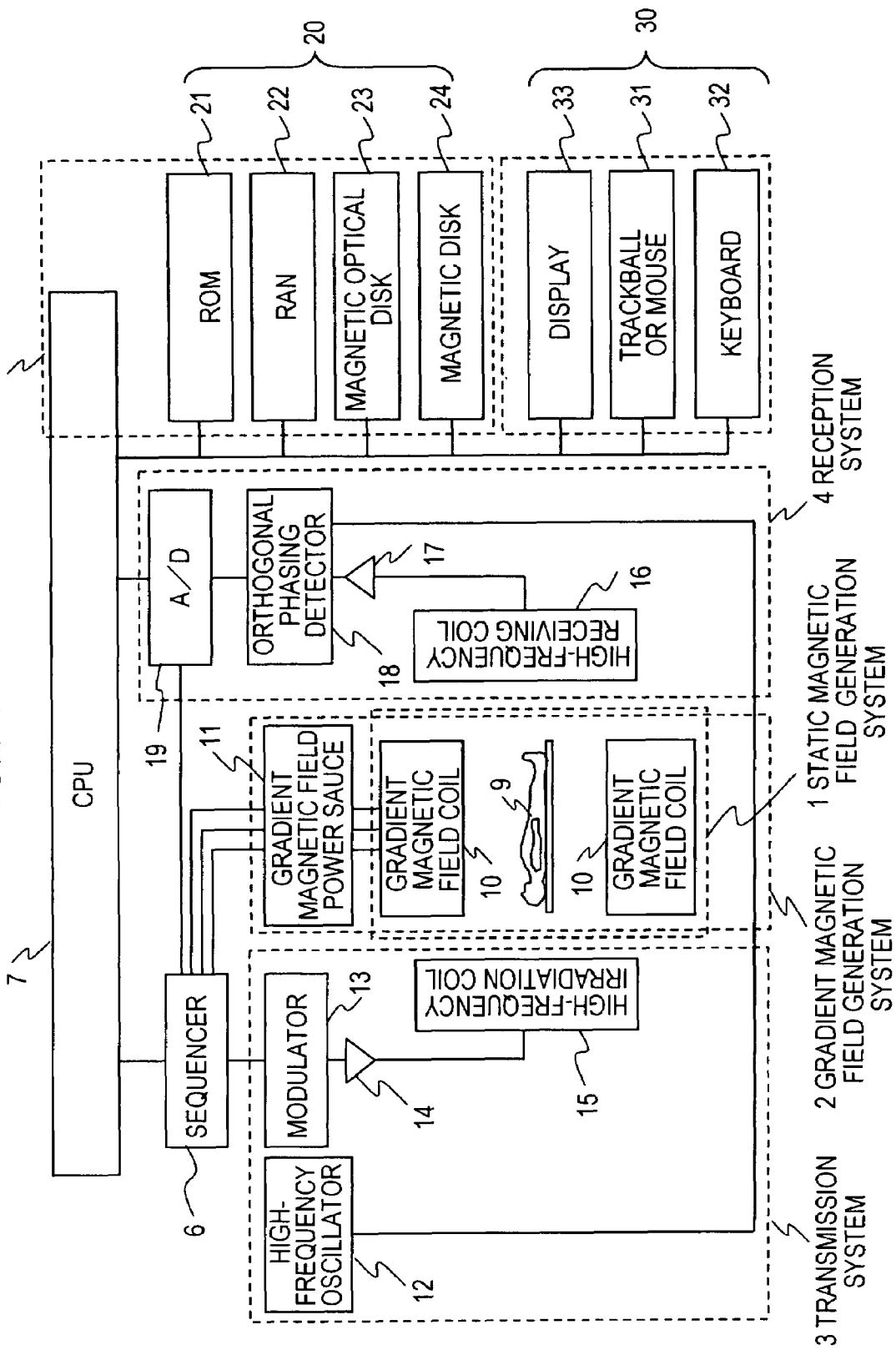
FIG. 1 is a block diagram showing the overall configuration of the MRI apparatus relating to the embodiment of the present invention.

FIG. 1 is a block diagram showing the overall configuration of the MRI apparatus related to the embodiment of the present invention. As shown in FIG. 1, this MRI apparatus mainly comprises static magnetic field generation system 1, gradient magnetic field generation system. 2, transmission system 3, reception system 4, signal-processing system 5, and a control system (sequencer 6 and CPU 7).

Static magnetic field generation system 1 is a system for generating an even static magnetic field in the space around subject 9 (imaging space), and it comprises magnetic devices such as permanent magnet method, normal conducting method, and a super conducting method. The magnetic apparatus in the present embodiment includes the ferromagnetic materials that generate the residual magnetic field. Specifically the magnetic apparatus of the present invention is the permanent magnet method using a ferromagnet, the normal conduction method or the super conduction method using a ferromagnetic central core of iron or magnetic circuits. Consequently as described above, there is the problem that the residual magnetic field with hysteresis phenomenon would be generated by the application of the gradient magnetic field pulses. Also, the direction of the static magnetic field is generally either the body axis direction of the subject or the orthogonal direction thereto.

When, for example, the direction of the static magnet field is z-direction and the two directions that are orthogonal thereto are x and y-directions, the gradient magnetic field system 2 is comprised of three gradient magnetic field coils 10 that generate the gradient magnetic field to said 3 directions and gradient magnetic field power source 11 that operates those coils respectively. By activating gradient magnetic field power source 11, the gradient magnetic field pulses can be generated in the direction of 3 axis that are x, y, and z, or the direction of which these directions are synthesized. The gradient magnetic field pulses are applied in order to create the positional information for the NMR signals being generated from subject 9. Also, though not shown in FIG. 1, a shimming means is provided in this system in order to upgrade the homogeneity of the static magnetic field being generated by the magnetic apparatus. The shimming means comprises the plurality of shim coils and a shim power source, and by activating the shim power source and applying an electric current through the shim coils, it is possible to remove the unevenness of the magnetic field that is inherent to this kind of apparatus and that is also caused by external factors.

Transmission system 3 comprises high-frequency oscillator 12, modulator 13, high-frequency amplifier 14, and high-frequency irradiation coil 15 for transmission. After modulating the generated high-frequency pulses by high-frequency oscillator 12 into predetermined signals of envelope by modulator 13, by amplifying the signals by high-frequency amplifier 14 and applying them to high-frequency irradiation coil 15, the electromagnetic waves (high-frequency signals) that generate nuclear magnetic resonance to the atomic nucleus of the atom that comprise the body of the subject are irradiated to the subject. High-frequency irradiation coil 15 is generally placed in the vicinity of the subject.

Reception system 4 comprises high-frequency reception coil 16 for the reception, amplifier 17, orthogonal phase detector 18, and A/D converter 19. NMR signals generated from the subject as a response to the electromagnetic waves that were irradiated from high-frequency irradiation coil 15 for the transmission, are detected by high-frequency reception coil 16 for the reception, amplified by amplifier 17, then converted into digital quantity by A/D converter 19 via orthogonal phase detector 18, and transmitted to signal-processing system 5 as two sequences of collecting data.

Signal-processing system 5 comprises CPU 7, storage device 20, and operation unit 30, and executes a various sorts of signal processing to the digital signals received in CPU 7 by reception system 4 such as Fourier transformation, correction coefficient calculation, and image reconstruction. Storage device 20 comprises ROM 21, RAM 22, magnetic optical disk 23, and magnetic disk 24, and stores respectively, for example, the programs to execute image analysis processing/ measurement with time or permanent parameter to use for the implementation of those programs to ROM 21, measurement parameter obtained by total measurement or the echo signals being detected by the reception system to RAM 22, and reconstructed image data to magnetic optical disk 23 or magnetic disk 24. Operation unit 30 comprises an input means that includes trackball or mouse 31, keyboard 32 and so forth, and display 33 that displays the necessary GUI for input and processing results in signal-processing system 5. The necessary information for various types of processing or controlling performed by CPU 7 is inputted via operation 30. Also the images obtained by imaging are displayed on display 33.

The controlling system comprises CPU 7 and sequencer 6, and controls the operation of the above-described gradient magnetic field generation system 2, transmission system 3, reception system 4 and signal-processing system 5. Specifically, the application timing of the gradient magnetic field pulses and high-frequency pulses being generated by gradient magnetic field generation system 2 and transmission system 3 and the timing for obtaining the echo signals by reception system 4 are controlled by predetermined pulse sequence being determined by the imaging method via sequencer 6.

MRI apparatus of the present invention, even though not shown in FIG. 1, comprises a residual magnetic field correction means for correcting the residual magnetic field being generated in the magnetic apparatus by the application of the gradient magnetic field pulses. This residual magnetic field correction means can be provided as a part of the control system, and can perform the correction, for example, either by varying the application current of exiting gradient magnetic field coils, or by controlling to prepare new correction coil as the attachment to the gradient magnetic field system and then to apply the current to the new correction coil. The correction executed by changing the application current of existing gradient magnetic field coils has the advantage that the apparatus would remain simple since the new coils need not be added, and the correction executed by using new correction coils has the advantage that the designing of the correction coils that can apply more precise correction magnetic field become possible by making them correspond to the generated residual magnetic field.

The case for preparing the new correction coils will now be described with an example.

Figure 2:
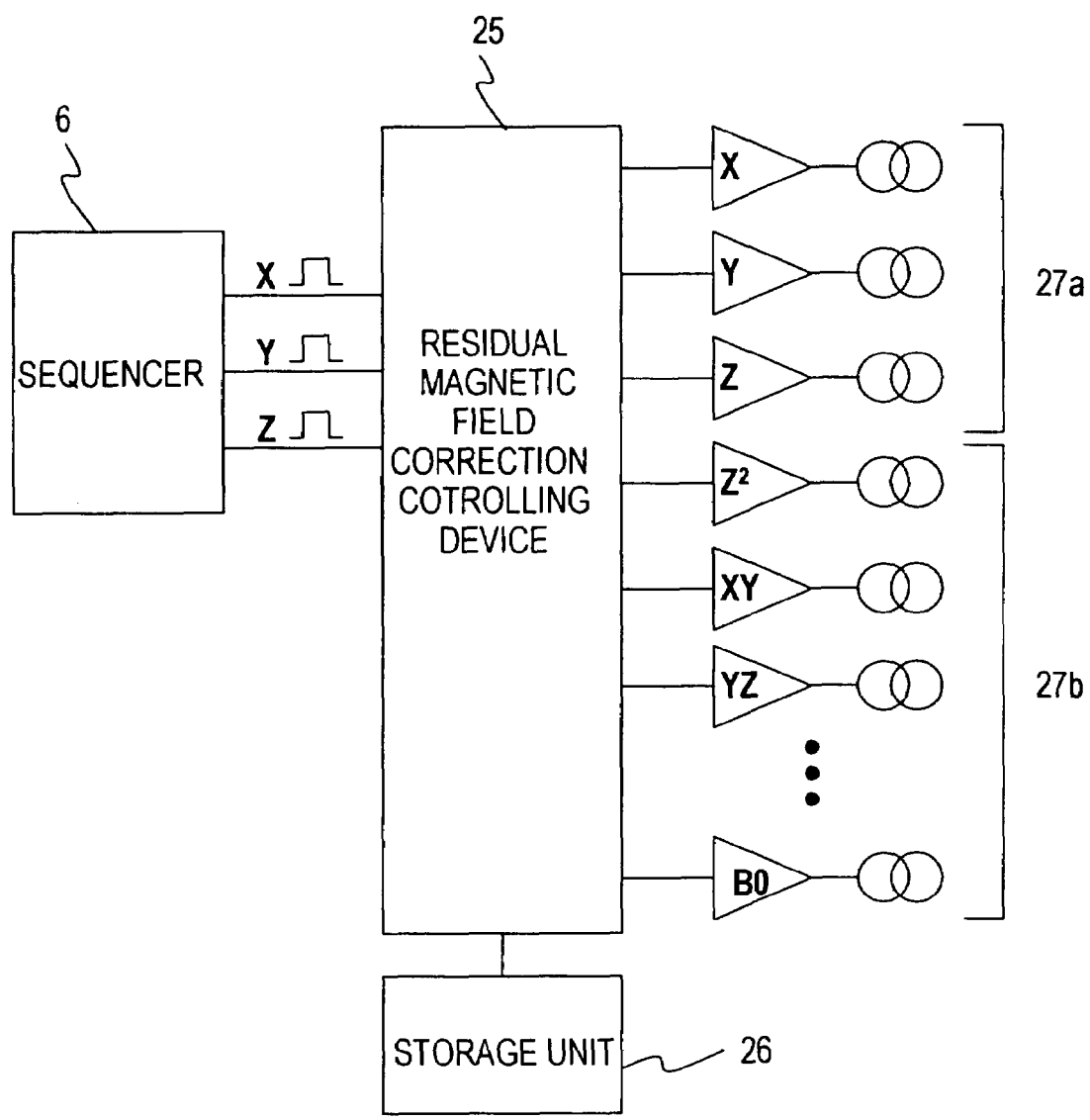
FIG. 2 is a diagram showing an example of the gradient magnetic field correction means.

An example of the residual magnetic field correction means is illustrated in FIG. 2. According to FIG. 2, residual magnetic field correction means comprises residual magnetic field correction control device 25, storage unit 26 for storing the residual magnetic field response function, and correction coils 27a and 27b, and residual magnetic field correction control device 25 is connected to sequencer 6, storage unit 26 is connected to residual magnetic field correction control device 25, and correction coils 27a and 27b are respectively connected to residual magnetic field correction control device 25. The configuration such as above makes it possible for the respective elements to share the function for correcting the residual magnetic field. It should be noted however that correction coil 27a is for generating the correction magnetic field that has the same axis as the three axis of the gradient magnetic field, and correction coil 27b is for generating the correction magnetic field of the components other than those of having the same axis as the three axis of the gradient magnetic field.

The residual magnetic field response function is a function that represents the relation between the strength of the gradient magnetic field pulse to be applied next (including the absolute value and the polarity) and the strength of the residual magnetic field being generated by the application of the gradient magnetic field thereof (including the absolute value and the polarity), taking into consideration the application history of the gradient magnetic field that are applied in the meantime. This function can be represented by drawing the curves (hereinafter referred to as residual magnetic field response curves or RM curves) on the 2-dimensional chart, with the strength of the gradient magnetic field pulses to be applied next as the horizontal axis (x-axis) and the strength of the residual magnetic field being generated by said applied gradient magnetic field pulses as the vertical axis (y-axis). Representing the chart in this manner enables the operators to easily grasp the whole picture of the residual magnetic field response function.

When the information on the strength of the gradient magnetic field pulses to be applied next is transmitted from sequencer 6, residual magnetic field correction control device 25 calculates how much of the strength of the residual magnetic field is going to be generated upon the application of the gradient magnetic pulses, using the residual magnetic field response function including RM curves with the application history of the gradient magnetic field in consideration at the time, and further calculates the strength of the correction magnetic field (including the absolute value and the polarity) for canceling the residual magnetic field thereof. Then the controlling signals for applying the correction magnetic field that has the calculated strength as previously described is transmitted to the power source for activating the correction coils (not shown in the diagram), and the correction magnetic field together with the gradient magnetic field pulses thereof is applied. At the same time, since the application history of the gradient magnetic field pulses are updated by the application of the gradient magnetic field pulses, depending on the updating of the application history thereof, the residual magnetic field response function including RM curves are also updated on the basis of the predetermined rules. Hereinafter, when the gradient magnetic field pulses are applied continuously, the same procedure will be exercised each time. According to the above-described procedure, the correction controlling of the residual magnetic field by residual magnetic field correction control device 25 can be executed effectively.

Next, in relation to the present embodiment, the calculation for the strength of the correction magnetic field using the residual magnetic field response function, and the algorithm for updating the residual magnetic field response function with the consideration of the application history of the gradient magnetic field will now be described.

First, the algorithm for calculating the strength of the correction magnetic field for correcting the residual magnetic field is performed as follows: first the generated residual magnetic field is calculated by obtaining the value of y on the RM curve in the case when the value of x represents the strength of the given gradient magnetic field using RM curves on the newest residual magnetic field response function with consideration of the application history, and then calculating the strength of said residual magnetic field with the recognition that the magnetic field of the opposite direction from the generated residual magnetic field as the correction magnetic field.

Next, the updating algorithm of the RM curves for the calculation of the above-mentioned correction magnetic field will be described.

The updating algorithm of the RM curves in the present embodiment is performed as follows: first the RM curves are measured as setting the RM curves of after the application of one maximum gradient magnetic field pulse after degaussing (to the direction of either positive or negative terminal) as the basic RM curves, maintained as a calibration data in storage unit 26, then the RM curves after the application of the discretional gradient magnetic field pulses are calculated based on the calibration data thereof and the predetermined rules that are to be explained later, and are updated and stored in storage unit 26. In this way, setting the basic RM curves in advance and using them as the calibration data makes it possible to execute the updating of the residual magnetic field response function that are made dependent on the discretional application history. The details will be described thereinafter.

First, the basic RM curves to be maintained as the calibration data will now be explained. There is an RM curve after degaussing (in the condition with no application history) shown in FIG. 3 as one of the basic RM curves, and this is set as a basic RM curve R1 after degaussing. It should be noted that in FIG. 3 the horizontal axis represents the strength of the gradient magnetic field pulses to be applied next, the vertical axis represents the strength of the residual magnetic field being generated by the applied gradient magnetic field pulses, and the black circle represents the measurement results. Also the chart in lower right shows the embodiment for measuring the residual magnetic field by applying gradient magnetic field pulse 501 with various strengths in the condition with no application history.

This basic RM curve R1 after degaussing is in proportion to the strength of the applied gradient magnetic field pulses. As the strength of the applied gradient magnetic field pulses increases at the positive terminal, the residual magnetic field also increases toward the direction of the positive terminal, and as the strength of the applied gradient magnetic field pulses and its absolute value increases at the negative terminal, the residual magnetic field and its absolute value also increase toward the direction of the negative terminal. There is a range (range A) however, in the vicinity of the original point that no residual magnetic field is generated with the application of the small strength of the gradient magnetic field, and only that portion R1 appears on the x-axis.

Figure 6A:
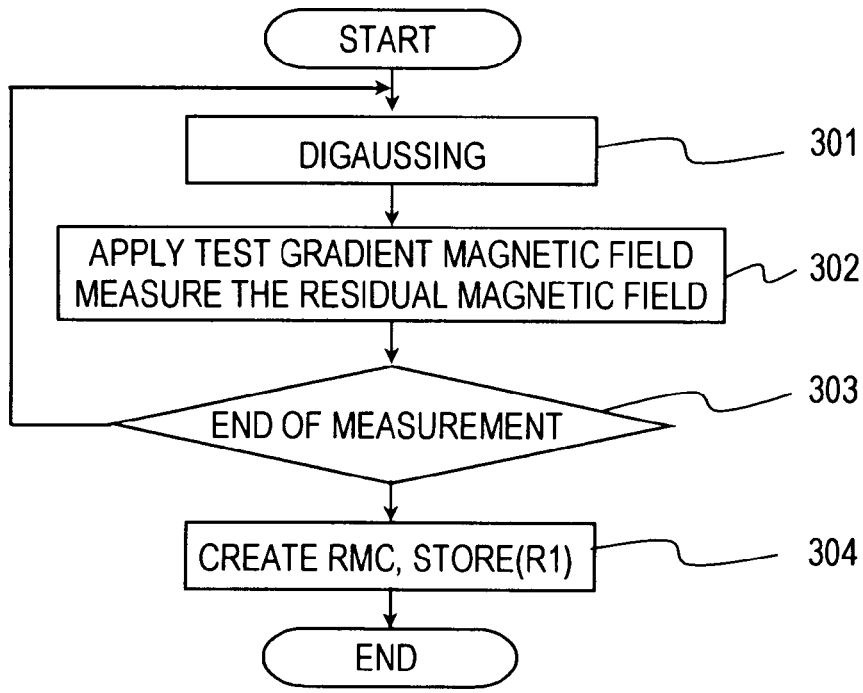
FIG. 6a is a flow chart of the procedure for measuring the basic RM curve R1 after degaussing.

The basic RM curve R1 after degaussing is an inherent curve in the apparatus, and is measured in advance in this embodiment according to the procedure shown in the flow chart of FIG. 6a. Next the respective procedures of the measurement in FIG. 6a will be explained.

(Step 301)

The residual magnetic field being maintained in a magnetic apparatus is degaussed. The well-known methods, for example, a method to apply the degaussing pulses, can be used to demagnetize the residual magnetic field. This degaussing pulses comprise a sequential pulse line, after applying the gradient magnetic field of maximum strength that the apparatus can apply, that sequentially degenerate the amplitude as the polarity is alternately inverted and apply the gradient magnetic field pulses as shown in FIG. 7a. By applying such degauss pulses to all three directions, it is possible to delete the residual magnetic field being maintained by the ferromagnet of the apparatus (for example, the permanent magnet). In addition, even though FIG. 7a shows a degauss pulse line made of 8 pulses as an example, the number of pulses and/or application time can be altered as circumstances demand.

(Step 302)

Next, the generated residual magnetic field is measured by applying the test gradient magnetic field pulses that have the discretional waveforms. The test gradient magnetic field pulses to be applied here can be either an individual pulse as shown in FIGS. 7(b) and (c), or the combination of plural pulses as shown in FIG. 7(d). Also, the measurement method of the residual magnetic field being generated by measuring the test gradient magnetic field pulses can be either, for example, the method for measuring with the Tesla meter, or the method for imaging by RF excitation to MRI phantom using the gradient magnetic field with a small strength so that the residual magnetic field would not be variegated. In the case of using the MRI phantom, the residual magnetic field can be calculated from the phase variation, since the phase map of the images reflects the residual magnetic field without modification.

(Step 303)

The strength of the test gradient magnetic field pulses as described above is varied from the strength of the maximum gradient magnetic field that the device can apply on the positive terminal (+G max) to the strength of the maximum gradient magnetic field on the negative terminal (−G max), and the residual magnetic field is measured at each of the strength. When all of the strength of the gradient magnetic field is measured, the next step (step 304) is to proceed. When there are strength of the gradient magnetic field that are not measured, (step 301) is to proceed.

(Step 304)

Figure 4:
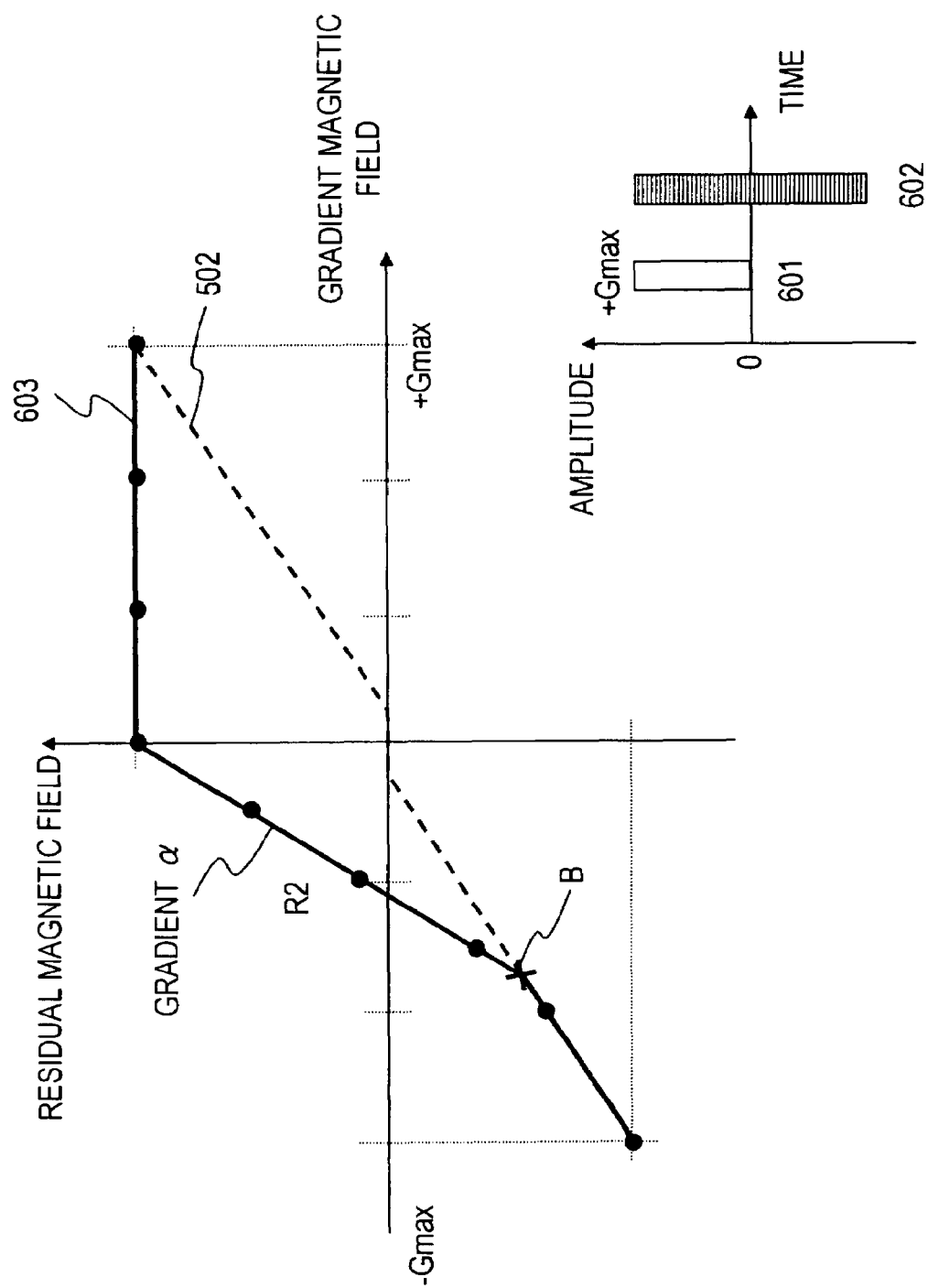
FIG. 4 is a diagram showing a basic RM curve after the application of the maximum gradient magnetic field on the positive terminal side.
Figure 5:
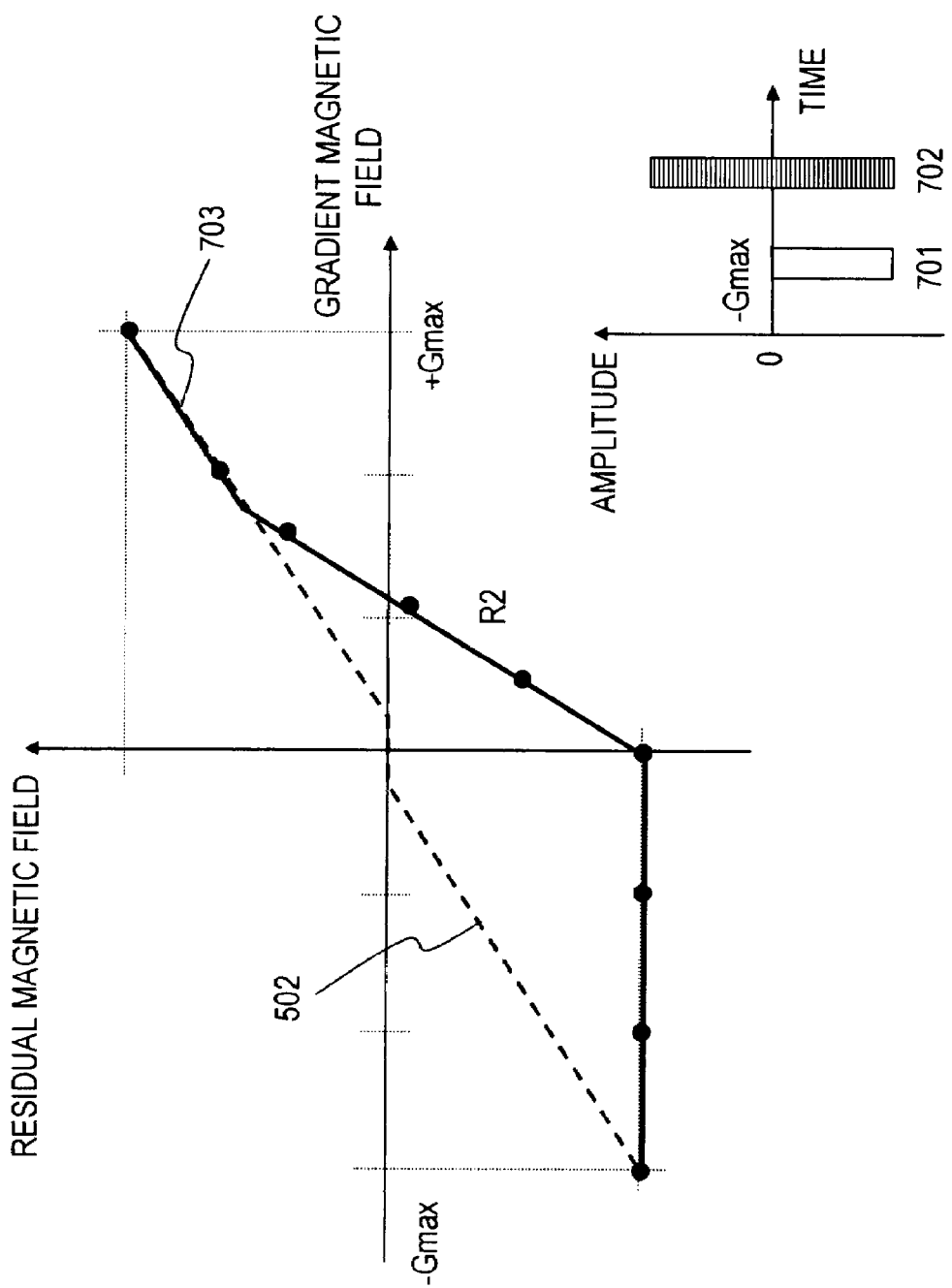
FIG. 5 is a diagram showing a basic RM curve after the application of the maximum gradient magnetic field on the negative terminal side.

The relation between the strength of the applied test gradient magnetic field pulses and the strength of the residual magnetic field being generated by the application of the test gradient magnetic field pulses is drawn as a curve on the function consisting of X-axis and Y-axis, and this curve is set as a basic RM curve R1 after degaussing. This basic RM curve R1 after degaussing is stored in storage unit 26 of the residual magnetic field correction means. Next, there are other basic RM curves that remain after applying one maximum gradient magnetic field after degaussing shown in FIG. 4 and FIG. 5, and are denoted as the basic RM curves R2+ and R2− after applying the maximum gradient magnetic field on the positive and the negative terminal side. FIG. 4 illustrates the basic RM curve R2+ after applying the maximum gradient magnetic field on the positive terminal side, and FIG. 5 illustrates the basic RM curve R2− after applying the same on the negative terminal side.

R2+ in FIG. 4 forms a straight line parallel to the x-axis on the positive x-direction side that maintains a steady residual magnetic field value after the application of the maximum gradient magnetic field pulse (+G max) (herein after the straight line parallel to the x-axis is also referred as the plateau). As the plateau crosses over y-axis, in accordance with the increase of the absolute value toward the negative direction of the x-axis, the value of R2+ decreases along with gradient α, and at a certain point (point B) it meets the basic RM curve R1 and subsequently decreases in line with R1. Also, R2− of FIG. 5 is a form in which R2+ is rotated 180-degree with the origin as a center.

Figure 6B:
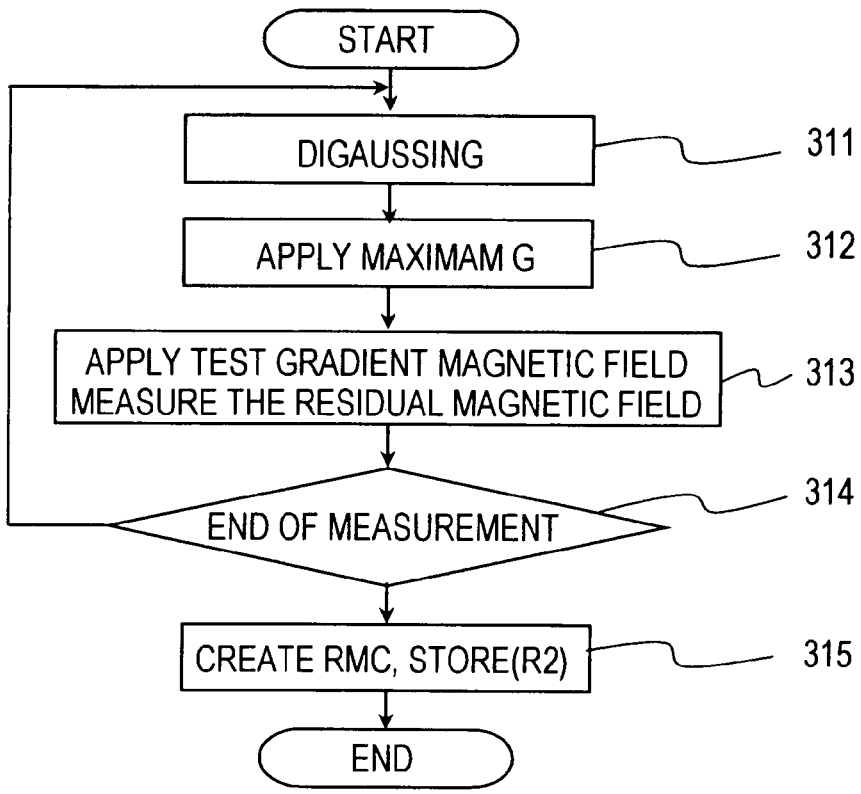
FIG. 6b is a flow chart of the procedure for measuring the basic RM curves R2+ and R2− after the application of the maximum gradient magnetic field on either positive or negative side.

These R2+ and R2−, particularly gradient α on the occasion of varying toward the opposite direction of the Y-axis corresponding to the above-mentioned plateau, is an inherent curve in the apparatus, and is measured in advance according to the procedure shown in the flow chart FIG. 6b. Next, the respective procedures in FIG. 6b will be described.

(Step 311)

First, the residual magnetic field is demagnetized according to the same procedure as the above-mentioned (step 301).

(Step 312)

The gradient magnetic field pulse of maximum strength (+G max) is applied as shown in the lower right section 601 of FIG. 4.

(Step 313)

The residual magnetic field being generated by the application of the gradient magnetic field pulse 602 is measured.

(Step 314)

Here also the strength of the second gradient magnetic pulse that the apparatus can apply is varied from the maximum strength on the positive terminal side (+G max) to the maximum strength on the negative terminal side (−G max), and the strength of the residual magnetic field is measured on each. When all of the strength of the gradient magnetic field is measured (step 315) is to proceed, and when there is strength that is yet not measured (step 311) is to proceed.

(Step 315)

a curve that represents the relation between the strength of the second gradient magnetic field pulse 602 and the strength of the residual magnetic field being generated from the mentioned application of the second pulse 602 is drawn, and it is set as R2+. The above-defined gradient α is measured in regard to R2+. The obtained R2+ and gradient α are stored in storage unit 26 of the residual magnetic field correction means.

The basic RM curve R2+ after the application of maximum gradient magnetic field on the positive terminal side is obtained according to the procedure described above as seen in FIG. 4, and the basic RM curve R2− after the application of maximum gradient magnetic field on the negative terminal side can be obtained either by rotating FIG. 4 180-degrees with the origin as a center or by setting gradient magnetic field pulse 601 as 701 of reverse polarity as illustrated in the lower right section of FIG. 5 and then following the same procedure of FIG. 6b. The obtained R2− is in the same way stored in storage 26 of the residual magnetic field correction means.

As described above, R1, R2+, R2− and gradient α are measured and obtained in advance before the actual imaging sequence, but the gradient magnetic field pulses of diverse waveform and strength are applied in the actual imaging sequence. In this embodiment, it is perceived that there is a certain regularity in the variation of the RM curves caused by the application of the gradient magnetic field pulses of diverse waveform and strength used in the actual sequence, and the RM curves are updated based on the rules to be explained below using the obtained RM curve R1, R2+, and R2. It should be noted that the regularity to be described below is examined and proposed by the data obtained from the experiments exercised by the inventors.

First, the RM curve in the case that the strength of the gradient magnetic field pulse of the first shot after degaussing is half of the maximum gradient magnetic field strength on the positive terminal side (+½ G max), R1 is varied as shown in FIG. 8. The chart in the lower right section in FIG. 8 illustrates that the residual magnetic field being generated in the cases when the strength of gradient magnetic field pulse 802 after applying gradient magnetic field pulse 801 which has the strength of +½ G max are varied in many ways, and that the generated residual magnetic field is represented as RM curves.

According to FIG. 8, when the strength of the applied gradient magnetic field is bigger than +½ G max, the RM curve is on the R1. When more than 0 and less than +½ G max, it is a plateau that maintains the strength of the residual magnetic field upon applying +½ G max as a steady value (the value pointed at MLPA). When the plateau meets the Y-axis the RM curve on the negative terminal side of X-axis direction is decreased based on gradient α, brought in line with R1 at the point MLNA, and decreased along with R1 subsequently.

Hereinafter in this embodiment the range that RM curves divagate from the basic RM curve R1 after degaussing by the application of the gradient magnetic field pulses is defined as CDML. Also, the maximum point of CDML toward x-axis direction is defined as MLPA, and the minimum point toward x-axis direction is defined as MLNA.

On the other hand, when the strength of the first shot of gradient magnetic field pulse after degaussing is the half of the maximum gradient magnetic field strength on the negative terminal side, the RM curve should be varied as the RM curve of FIG. 8 is rotated 180-degrees with the origin as the center. In the case that the first shot of the gradient magnetic field strength after degaussing is not exactly half of the maximum gradient magnetic field strength, first the position on R1 at the applied gradient magnetic field strength (equivalent to point MLPA in FIG. 8) is obtained according to the respective values, next the plateau parallel to X-axis from said position toward y-axis is drawn, after the plateau meets y-axis a straight line that decreases based on gradient α toward the opposite direction (of the plateau) is drawn, then when the straight line meets R1 again (MLNA) the line decreases along with R1, and the RM curve is drawn in proportion as FIG. 8. However, when the gradient magnetic field pulse strength of the first shot is as small as corresponding to the A region in FIG. 3, the RM curve would not be varied corresponding to R1.

Figure 9:
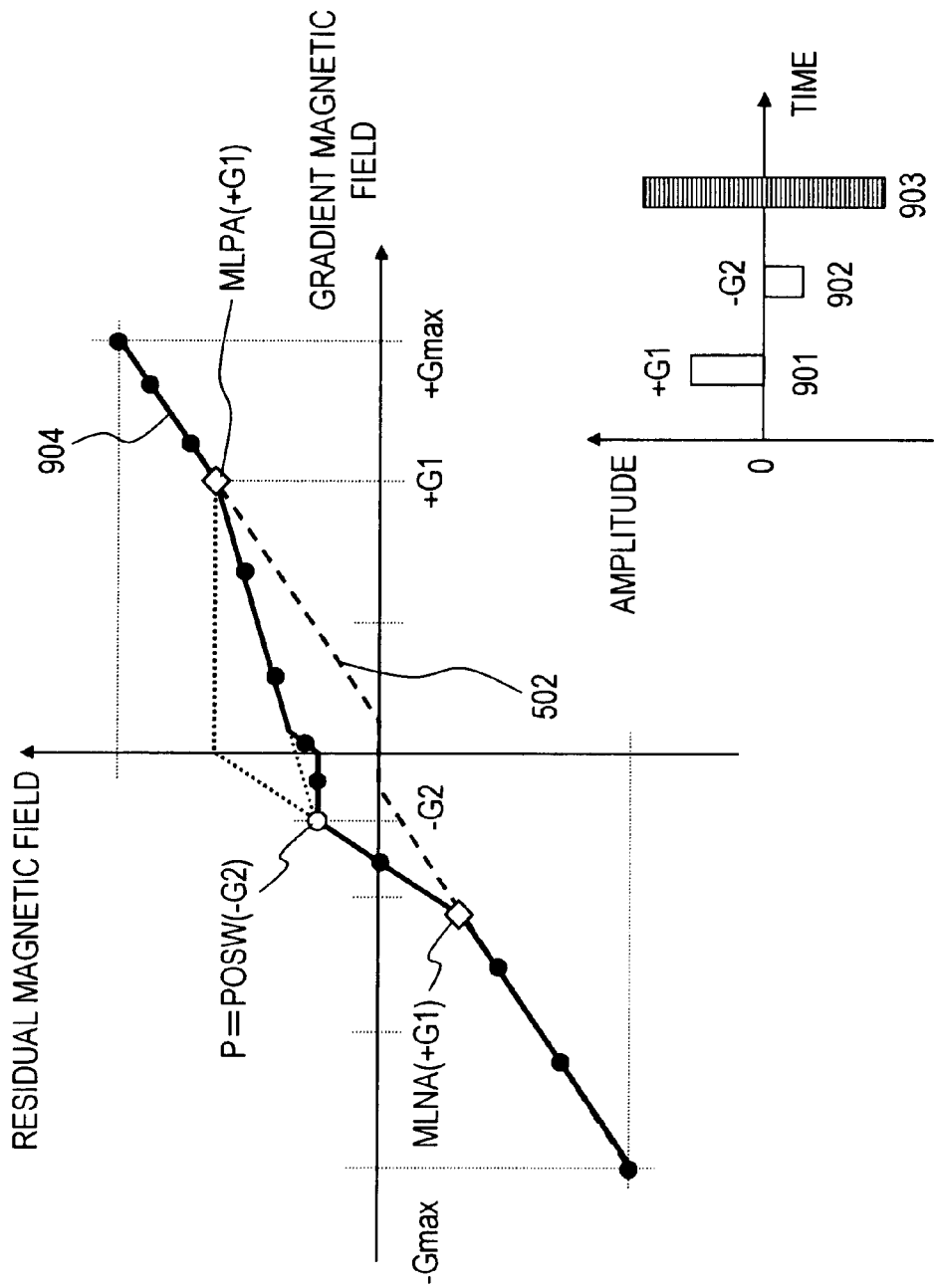
FIG. 9 is a diagram showing how the RM curve varies after degaussing upon applying two shots of the gradient magnetic field pulses with the opposite polarity, in the case of the absolute value of the second gradient magnetic field pulse being smaller than the absolute value of the first gradient magnetic field pulse.
Figure 10:
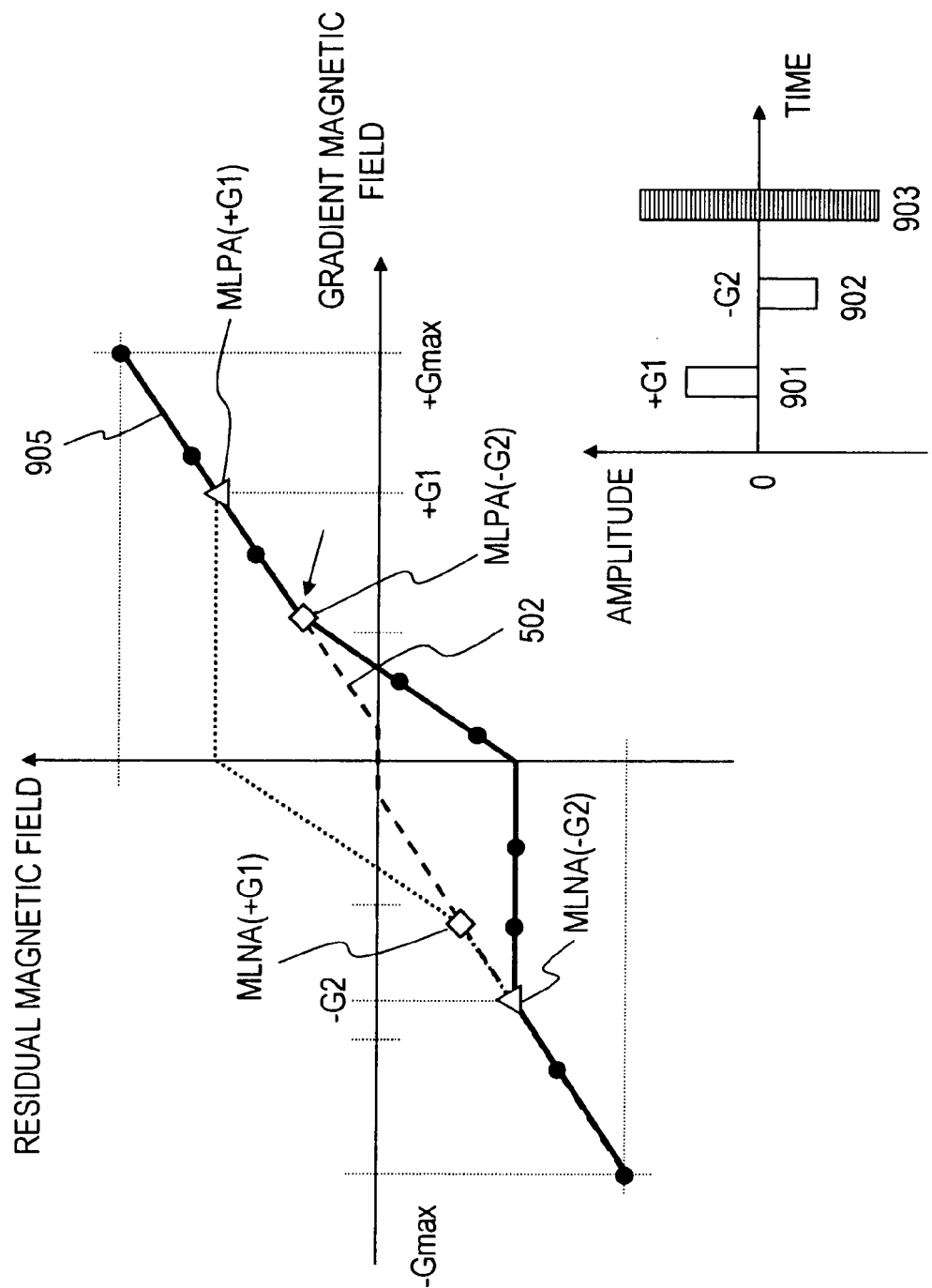
FIG. 10 is a diagram showing how the RM curve varies after degaussing upon applying two shots of the gradient magnetic field pulses with the opposite polarity, in the case of the absolute value of the second gradient magnetic field pulse being bigger than the absolute value of the first gradient magnetic field pulse.

Next, how to vary the RM curve in the case of applying two shots of gradient magnetic field pulses after degaussing will be described referring to FIGS. 9 and 10. Though both FIGS. 9 and 10 refer to the case when the first and second gradient magnetic pulses are opposite in polarity, FIG. 9 is a case when the absolute value of the second gradient magnetic field pulse is smaller than the first one, and FIG. 10 is a case when the absolute value of the second pulse is bigger than the first one. FIG. 9 and FIG. 10 will be explained in order below.

In the case when the polarity of gradient magnetic field pulses 901 and 902 are opposite and when those pulses are applied so that the absolute value of 902 is smaller than the one of 901 (the strength of the gradient magnetic field pulse 901 is referred as +G1 and 902 as –G2) as shown in the lower right section of FIG. 9, the RM curve after the application turns out as shown in FIG. 8 (MLPA and MLNA at this point is referred as MLPA(+G1) and MLNA(+G1)), but within the CDML portion on the RM curve in FIG. 8 will further be varied by the application of gradient magnetic pulse 902. To be more precise, on the RM curve in the condition of FIG. 8, when setting a point positioned in the direction of the negative terminal (–G2) and toward x-axis direction as POSW(–G2), a plateau is drawn from that point toward y-axis and parallel to x-axis. When the plateau meets the y-axis it starts to increase based on the above-mentioned gradient α, and after this increasing straight line meets another straight line that connects the above-mentioned POSW(–G2) and MLPA(+G1) it increases along with the line that connects POSW(–G2) and MLPA(+G1) up to MLPA(+G1). Then on and after reaching to MLPA(+G1), it is increased along with R1 again.

On the other hand, as shown in the lower right section of FIG. 10 in the case when the polarity of gradient magnetic field pulses 901 and 902 are opposite and those pulses are applied so that the absolute value of gradient magnetic field pulse 901 is bigger than the one of 902 (similarly to FIG. 9, gradient magnetic field strength of 901 is referred as +G1 and the same of 902 as –G2), the RM curve after the application of gradient magnetic field pulse 901 turns out as shown in FIG. 8 (MLPA and MLNA at this point are referred as MLPA(+G1) and MLNA(+G1)) but the outside portion of CDML on the RM curve in FIG. 8 will also be varied by the further application of gradient magnetic field pulse 902. In this case, on the RM curve in the condition of FIG. 8, as setting a point positioned in the direction of negative terminal –G2 and toward the direction of x-axis as MLNA(–G2), a plateau is drawn from this point toward y-axis and parallel to x-axis. When the plateau meets the y-axis, it starts to increase based on the above-mentioned gradient α toward the opposite direction to y-axis, and on and after this increasing straight line meets R1 it is increased along with R1.

Figure 11:
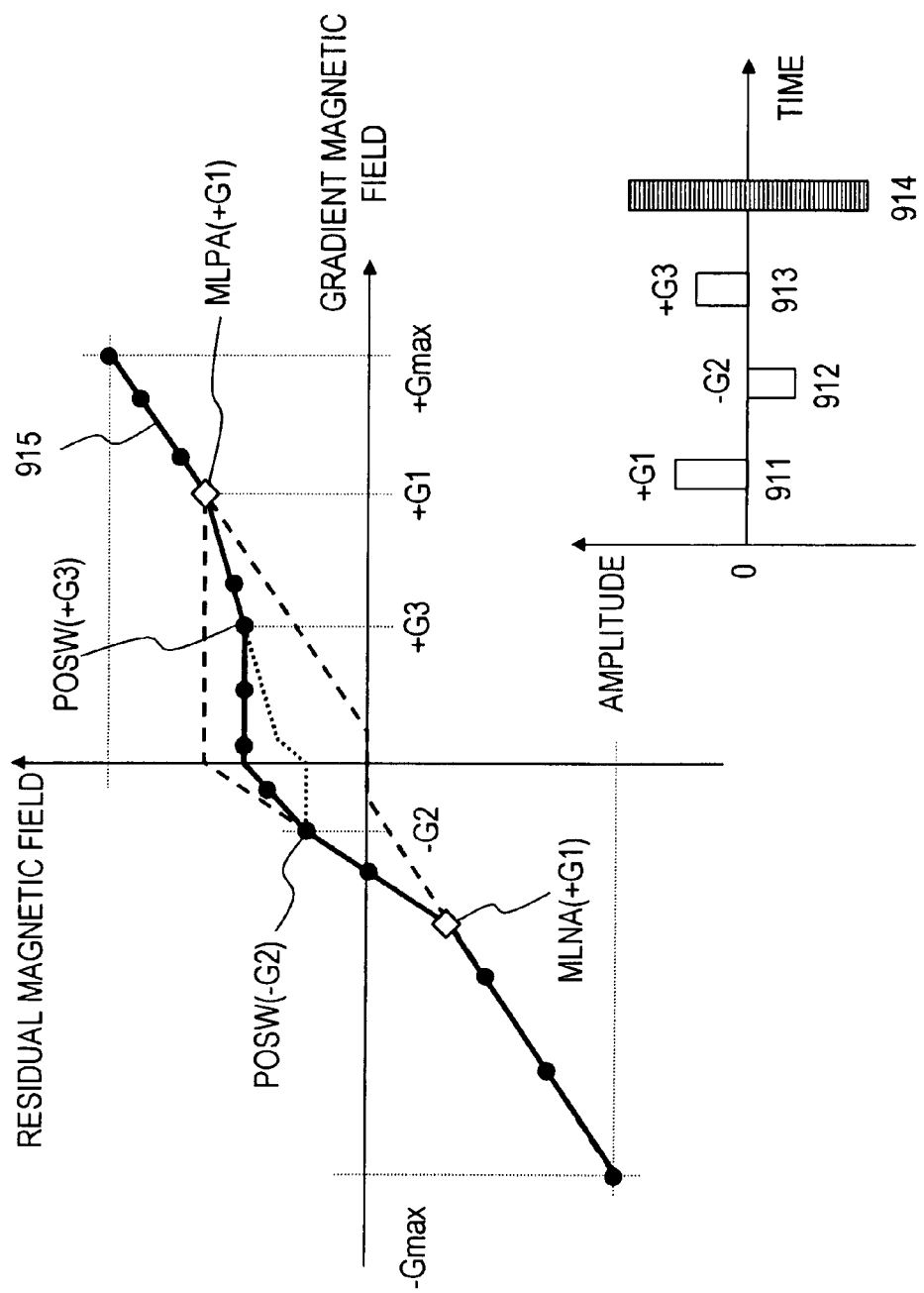
FIG. 11 is a diagram showing how the RM curve varies after degaussing in the case of applying three shots of gradient magnetic field pulses.

Described above are the variation examples of the case when two shots of the gradient magnetic field pulses are applied after degaussing, and now another example of the case when three shots of the gradient magnetic field pulses are applied after degaussing will be illustrated referring to FIG. 11. It should be noted here that FIG. 11 is the example when the polarity of the first shot (911) and the third shot (913) are on the positive terminal side and the second shot (912) is on the negative terminal side (the gradient magnetic field pulse strength of 911 is referred as +G1, the same of 912 as –G2, and the same of 913 as +G3), and when the absolute value of 911 is bigger than the one of 912 similarly to FIG. 9 and the absolute value of 913 is smaller than the one of 911 and bigger than the one of 912. In this case the RM curve when 911 and 912 are applied will turn out as shown in FIG. 9, but it will be varied as described below with the application of 913. That is as setting a point on the RM curve in FIG. 9 positioned at +G3 toward the x-axis direction as POSW(+G3), and a plateau is drawn from this point toward the direction of the y-axis and parallel to the x-axis. From the point where this plateau meets the y-axis, a straight line is drawn toward POSW(–G2), decreasing from POSW(–G2) toward MLNA(+G1). On and after reaching MLNA(+G1), it is decreased along with R1.

Figure 3:
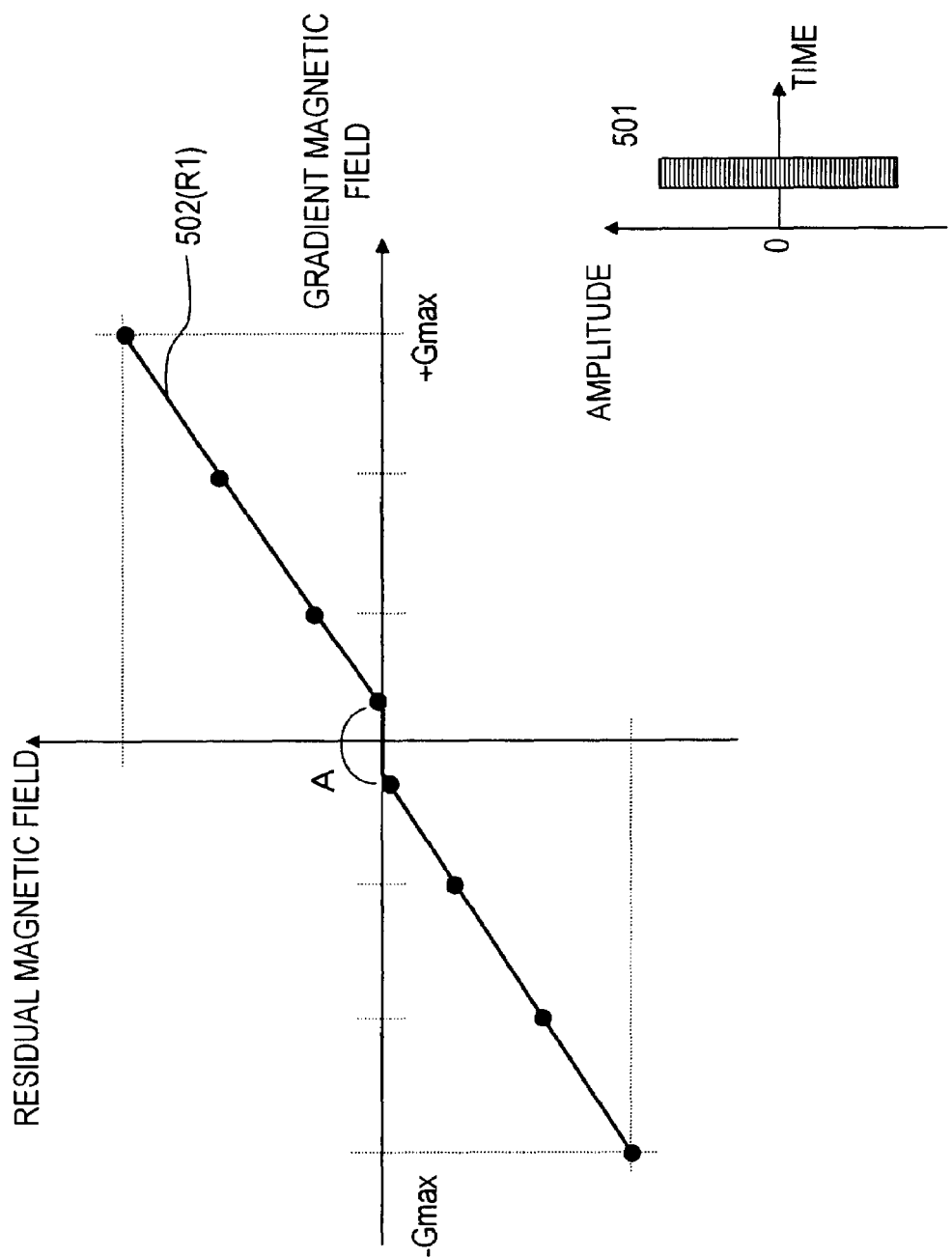
FIG. 3 is a diagram showing a basic RM curve after demagnetizing (a condition with no application history).

The variation of the RM curves shown in the above-described FIG. 8-11 are a few patterns of examples from those that are examined and exemplified by the inventor from the data obtained through experimentation, and the following is the simple summary of the characteristics related to the above-mentioned embodiments:

(1) The RM curve after degaussing takes a shape that the applied gradient magnetic field strength and residual magnetic field strength are almost in proportion as shown in FIG. 3, and it is set as the basic RM curve R1.

(2) The RM curve after degaussing and applying one shot of the gradient magnetic field pulse with maximum strength take shapes as shown in FIG. 4 or 5, and are primarily made up of a plateau toward the direction of applying one shot of the gradient magnetic field pulse and a straight line based on gradient α of the opposite direction against the previously mentioned direction. These RM curves after applying the maximum gradient magnetic field on the positive and the negative terminal side are set as the basic RM curves R2+ and R2– according to the direction of the applied gradient magnetic field pulses.

(3) The RM curves R1, R2+ and R2–, and gradient α in R2+ and R2– are measured in advance and maintained as the calibration data.

(4) The RM curve after degaussing and applying one shot of the gradient magnetic field pulse can be updated by setting a point on the curve R1 according to the strength of the gradient magnetic field pulse, drawing a plateau from that point toward the direction of the y-axis and parallel to the x-axis, and drawing a straight line from the point where the line meets the y-axis toward the opposite direction according to gradient α.

(5) The region where the RM curve divagates from R1 is defined as CDML, the maximum point CDLM toward the x-axis is defined as MLPA, and a minimum point of CDML toward the x-axis as MLNA.

(6) The RM curve, in the case of applying two or more shots of gradient magnetic field pulses after degaussing, can be obtained by updating it as varying by the predefined rules according to the direction and the strength of the sequentially applied gradient magnetic field pulse. It should be noted that the proceeding of the updating would be subtly different depending on whether the applied gradient magnetic field pulse strength is inside or the outside of CDML of the newest RM curve. Also, the RM curve would not be updated when the direction and the strength of the applied gradient magnetic field pulse are on the plateau within the newest CDML.

The above-described rules for updating the RM curves are now generalized as updating algorithm and illustrated in flow charts FIG. 12 to 16. The algorithm will sequentially be explained below.

1. The RM Curve Updating Process

First, a default value of the RM curves before starting the imaging is, for example, the basic RM curve R1 after degaussing shown in FIG. 3 or the basic RM curve (R2+ or R2−) after the application of the maximum gradient magnetic field on the positive or negative terminal side shown in FIGS. 4 and 5. In the case when R1 is used for the default value of the RM curve, both ends of the region where the residual magnetic field is not varied which is approximately 0 strength of the gradient magnetic field (region A in FIG. 3) are set as the default value of MLNA and MLPA.

(Step 1001)

Figure 12:
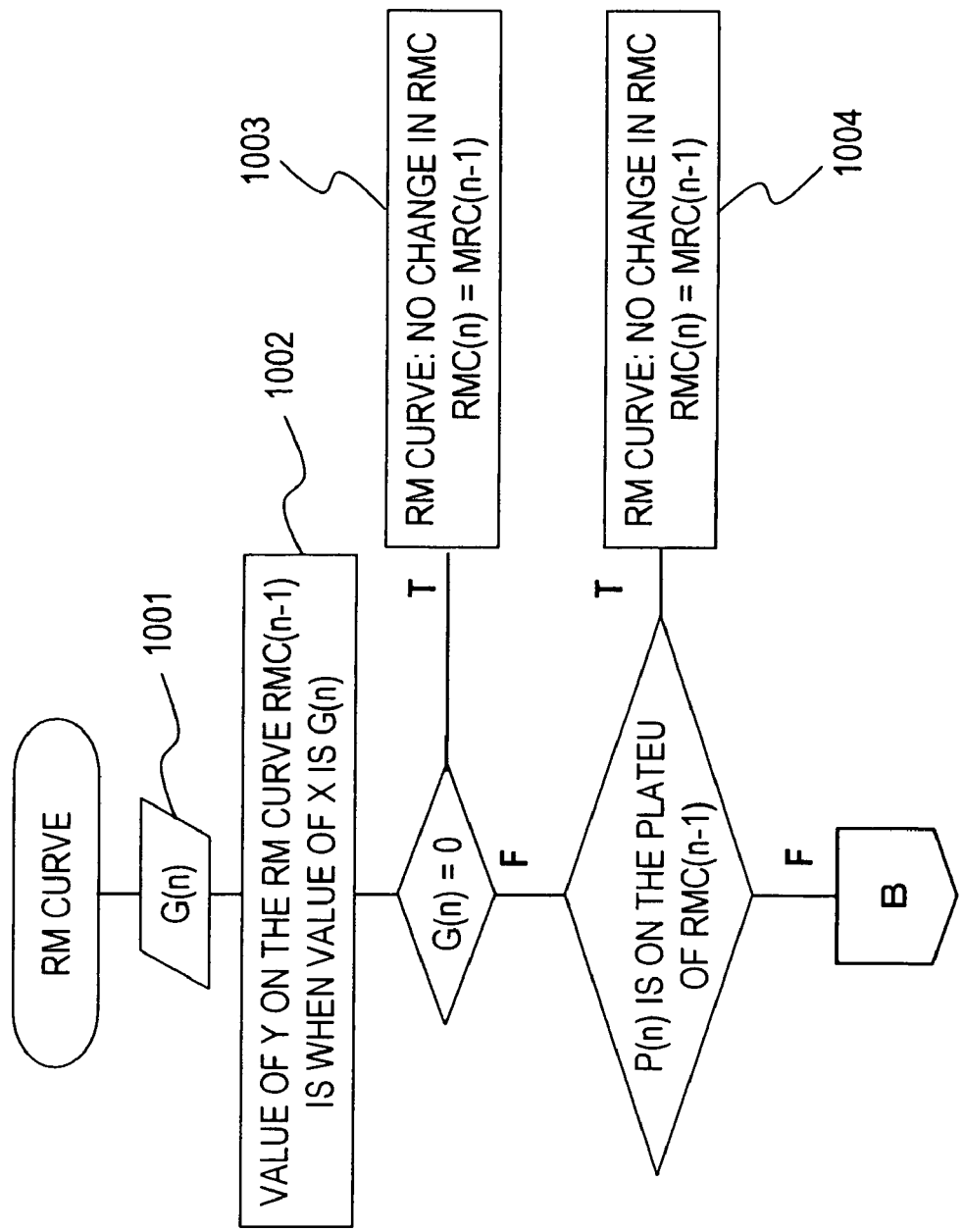
FIG. 12 is a flow chart of the generalized updating algorithm of the RM curves.

In FIG. 12, upon receiving the command for applying the n-number of shots of the gradient magnetic field pulse from sequencer 6, the strength of the gradient magnetic field pulse G(n)(n=1,2,3. . . ) is inputted in residual magnetic field correction device 25.

(Step 1002) In the newest RM curve RMC(n−1) stored in storage unit 26 at this point, P(n) which is the value of Y, on the RM curve RMC(n−1) in the case that the value of X is set as G(n), is obtained by residual magnetic field correction device 25.

(Step 1003)

If G(n) read in step 1001 at this point is 0, the RM curve RMC(n−1) is set as RMC(n)=RMC(n−1) without varying.

(Step 1004)

Also when P(n) is on the plateau of RMC(n−1), the RM curve RMC(n−1) is set as RMC(n)=RMC(n−1) without varying. When P(n) is outside of the plateau of RMC(n−1), process B will be followed. Process B is illustrated in the next FIG. 13.

2. Process B (Step 1005)

Figure 14:
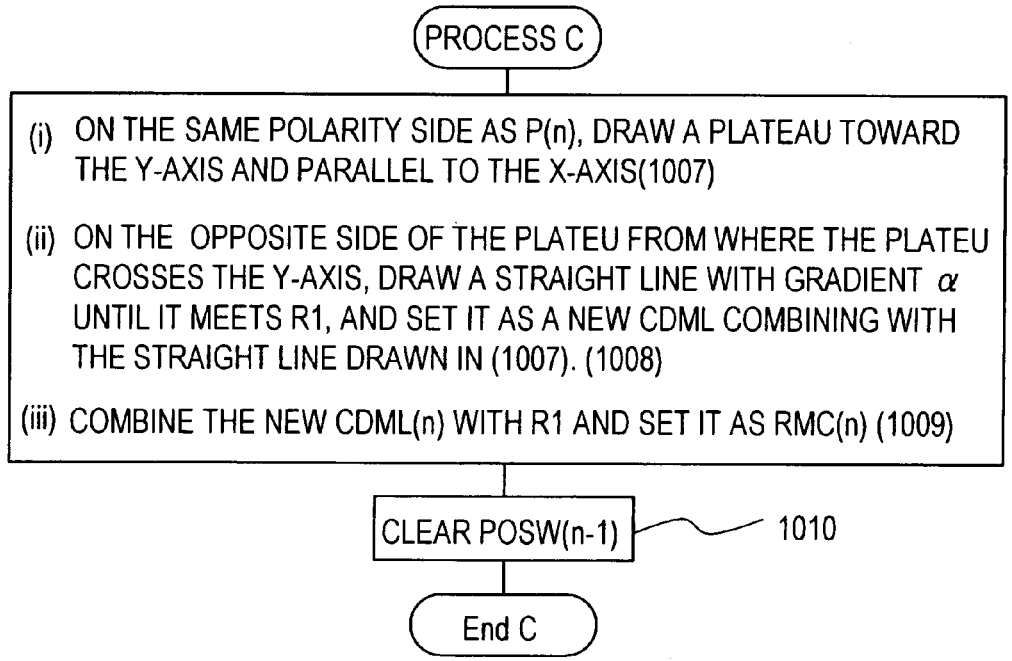
FIG. 14 is a diagram showing process C in the case that P(n) is not in the range of CDML(n−1).

In process B, first the judgment is made whether or not P(n) is within the range of CDML(n−1) in the newest RM curve RMC(n−1). More specifically, if G(n) is smaller than MLNA or bigger than MLPA, P(n) is not in the range of CDML(n−1) and thus process C is further to proceed, and the new RMC(n) will be created by updating CDML. Process C is illustrated in FIG. 14.

(Step 1006)

Figure 15:
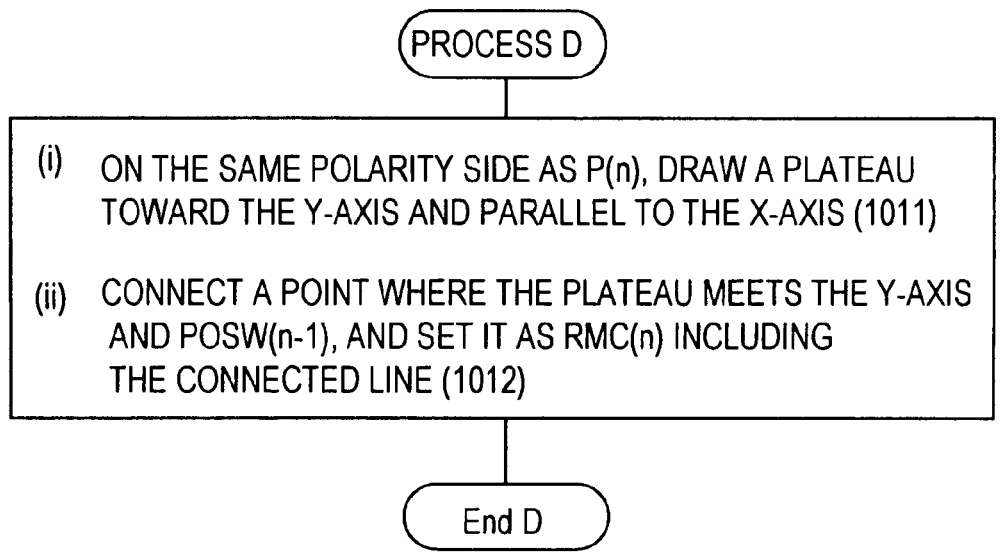
FIG. 15 is a diagram showing process D in the case that P(n) is on the same polarity side as the plateau of CDML(n−1).
Figure 16:
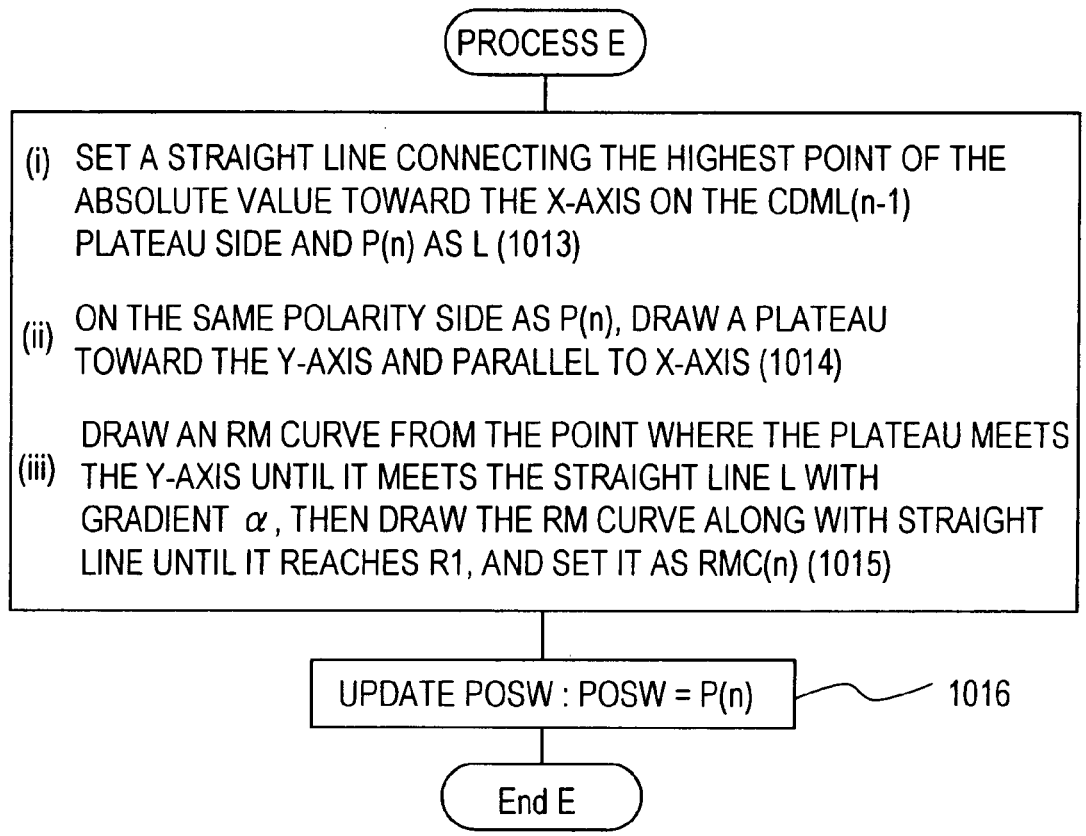
FIG. 16 is a diagram showing process E in the case that P(n) is on the opposite polarity side as the plateau of CDML(n−1).

On the other hand in step 1005, if the judgment is made that P(n) is within the range of CDML(n−1), the further judgment will be made as to whether or not the polarity of G(n) is the same as the one where the plateau of CDML(n−1) is. A different process will be taken (if the same process D, and if different process E) according to the above-mentioned judgments. Process D is illustrated in FIG. 15 and process E is illustrated in FIG. 16.

3. Process C (Step 1007)

Process C of FIG. 14 is a procedure for creating a new CDML(n), and a plateau is drawn from P(n) toward the direction of the y-axis and parallel to the x-axis for the same polarity side as P(n).

(Step 1008)

In the opposite side of the plateau from the point where it meets the y-axis, a straight line is drawn based on gradient a until it reaches R1, and set it as a new CDML(n) combined with the straight line drawn in (step 1007).

(Step 1009)

The new CDML (n) and R1 are combined and set as a new RMC(n)

(Step 1010)

With the updating of CDML, if there is POSW(n−1) that is defined with the condition before CDML is updated, it should be cleared.

The process in FIG. 14 corresponds to, for example, the process to create the RM curve shown in FIG. 8 from the basic RM curve after degaussing shown in FIG. 3, or to the process to update the RM curve shown in FIG. 10 from the RM curve shown in FIG. 8.

4. Process D

When the polarity of P(n) is the same as the plateau of CDML(n−1), process D shown in FIG. 15 is to proceed.

(Step 1011)

First, on the same polarity side as P(n), a plateau is drawn parallel to the x-axis toward the y-axis.

(Step 1012)

Then a point where the plateau meets y-axis and POSW (n−1) are connected, and set as RMC(n) including step 1011.

This process corresponds to, for example, the process to create the RM curve shown in FIG. 11 from the condition shown in FIG. 9.

5. Process E

Figure 13:
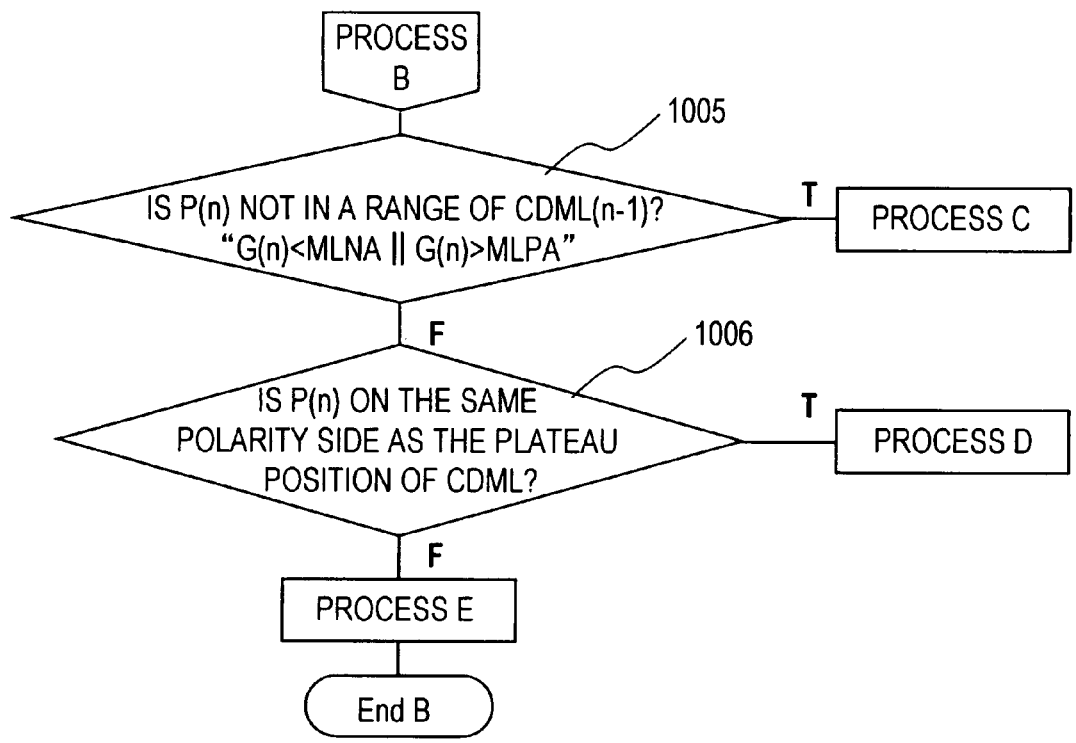
FIG. 13 is a diagram showing process B, in the case that P(n) is outside of the plateau of RMC(n−1).

In step 1006 of FIG. 13, when the polarity of P(n) is the opposite from the plateau of CDML(n−1), process E shown in FIG. 16 is to proceed.

(Step 1013)

A straight line connecting a point at a maximum absolute value of the plateau of CDML(n−1) toward the direction of the x-axis and P(n) is set as L.

(Step 1014)

Further, on the same polarity side as P(n), a plateau is drawn parallel to the x-axis toward the y-axis.

(Step 1015)

On the opposite side from the plateau with y-axis in between, from the point where the plateau crosses the y-axis, the RM curve is drawn with gradient α until it reaches straight line L. When straight line L is reached, the RM curve is drawn along with a straight line L until it meets R1, and this is set as RMC(n).

(Step 1016)

POSW is updated by setting P(n) as new POSW(n). This process corresponds to, for example, the process to create the condition as shown in FIG. 9 by updating within CDML shown in FIG. 8.

As described above, the RM curves responding to the application history of the gradient magnetic field are created and updated by exercising the explained sequential steps. The RM curve RMC(n) created in this way is used for applying (n+1) shots of gradient magnetic field pulse which are applied after n-shots of the gradient magnetic field pulses, and for calculating the correction magnetic field to cancel the residual magnetic field being generated by the application of these (n+1) shots of the gradient magnetic field pulse. Taking the RMC illustrated in FIG. 11 as an example, the residual magnetic field being generated by gradient magnetic field pulse 914 can be uniquely determined using RM curve 915 being calculated by the former application history (for example, gradient magnetic pulses 911, 912, and 913), and the affect of the residual magnetic field can be eliminated by superposing the correction magnetic field for correcting this residual magnetic field over gradient magnetic field pulse 914 as applied.

Next, in the MRI apparatus of the present embodiment, the residual magnetic field correction of the gradient magnetic field using the updating algorithm of the above-mentioned residual magnetic field response model will be described in detail.

Figure 17:
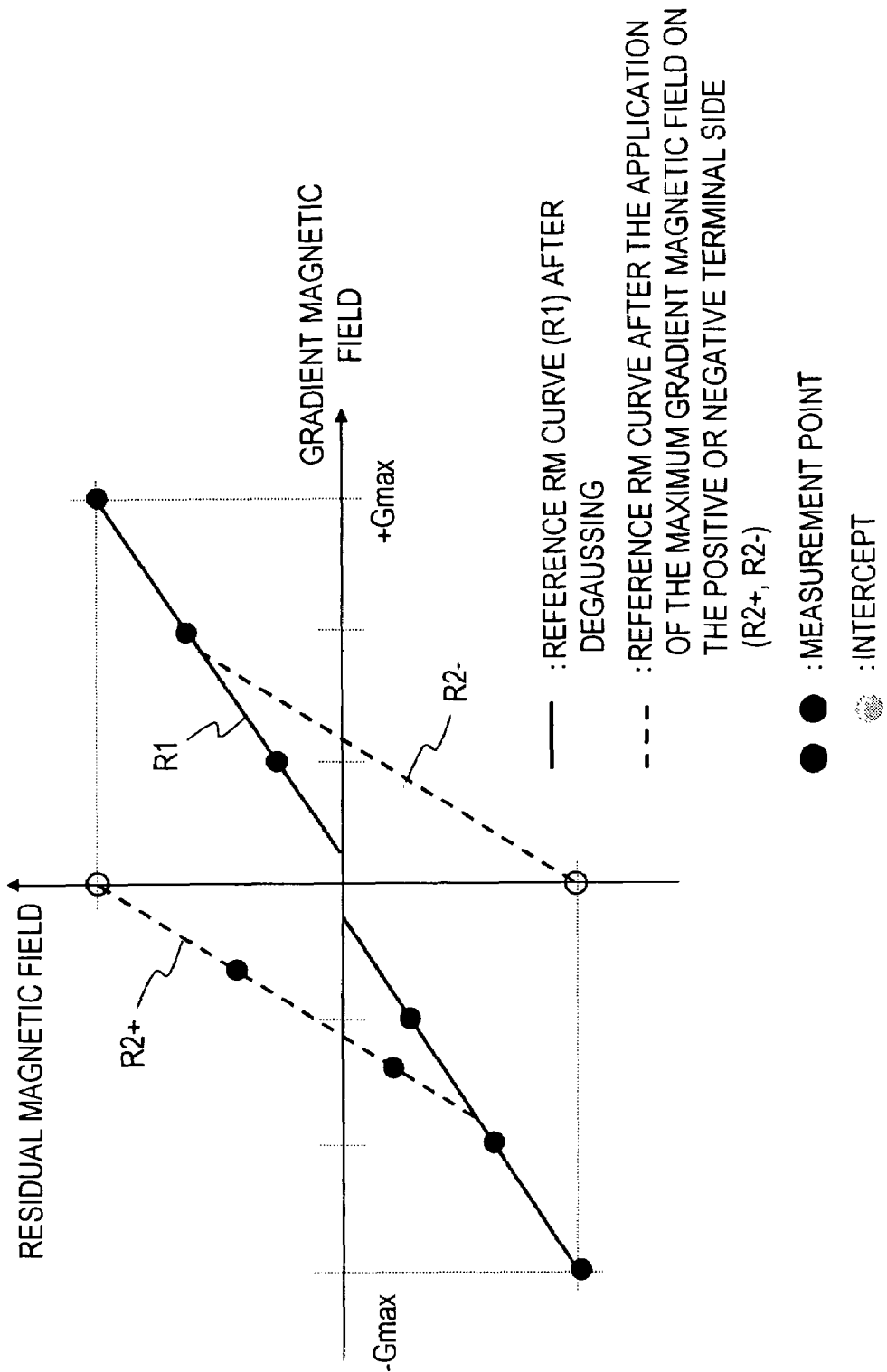
FIG. 17 is a diagram showing an example of the basic RM curve of the magnetic apparatus being stored in the storage unit.

First, FIG. 17 is an example of the basic RM curve (R1, R2+, and R2−) of the magnetic device being stored in storage unit 26 of residual magnetic field correction device 25, and in order to measure this in advance, only a few points denoted by the black dots in the diagram need to be measured.

Figure 18:
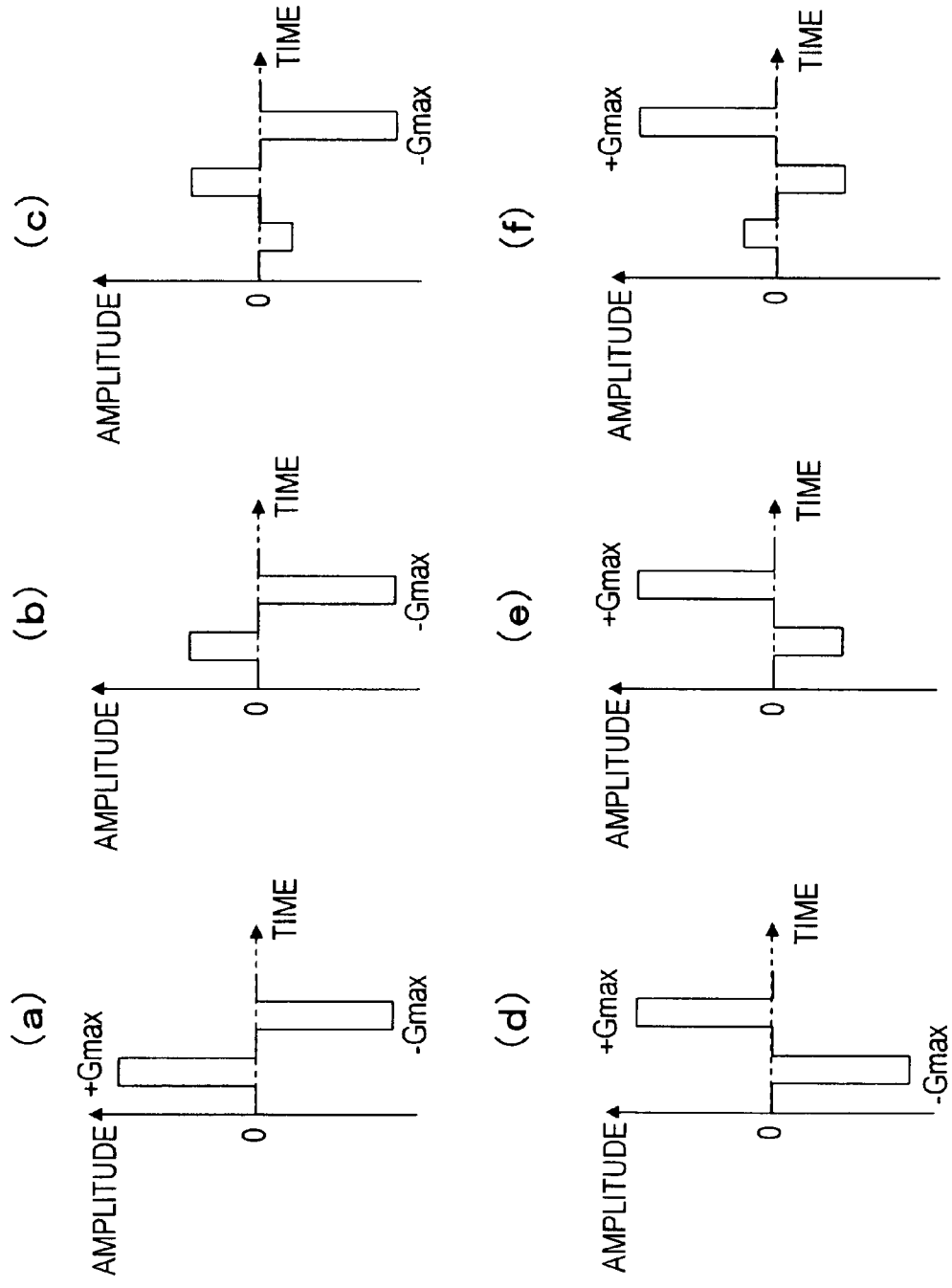
FIG. 18 is a diagram showing an example of the preparation pulse.

At the time of imaging, before starting all of the imaging sequence, the RM curve should be initialized, either to be in the condition illustrated in FIG. 3 upon degaussing the magnetic device by applying the degaussing pulse as shown in FIG. 7(*a*), or to be 603 illustrated in FIG. 4 or 703 illustrated in FIG. 5 upon applying the preparation pulses being formed by the plurality of pulse trains illustrated in (a)~(f) of FIG. 18 so that the last pulse of these preparation pulses will have the maximum gradient magnetic field strength of which the device can apply. By implementing the above procedure, if an error is included upon updating the residual magnetic field response curves for the calculation of the residual magnetic field, the error can be minimized.

After initializing the residual magnetic field of the apparatus, the imaging sequence will be started. In the process of executing the imaging sequence, upon every application of the gradient magnetic field pulse, the strength of the correction magnetic field for correcting the residual magnetic field being generated by applying the newest RM curve depending on the application history of the gradient magnetic field up to just before the application is calculated, and the RM curve is updated in real time according to the above-mentioned RM curve updating algorithm in order to correspond to the application of the next gradient magnetic field pulse.

Figure 19:
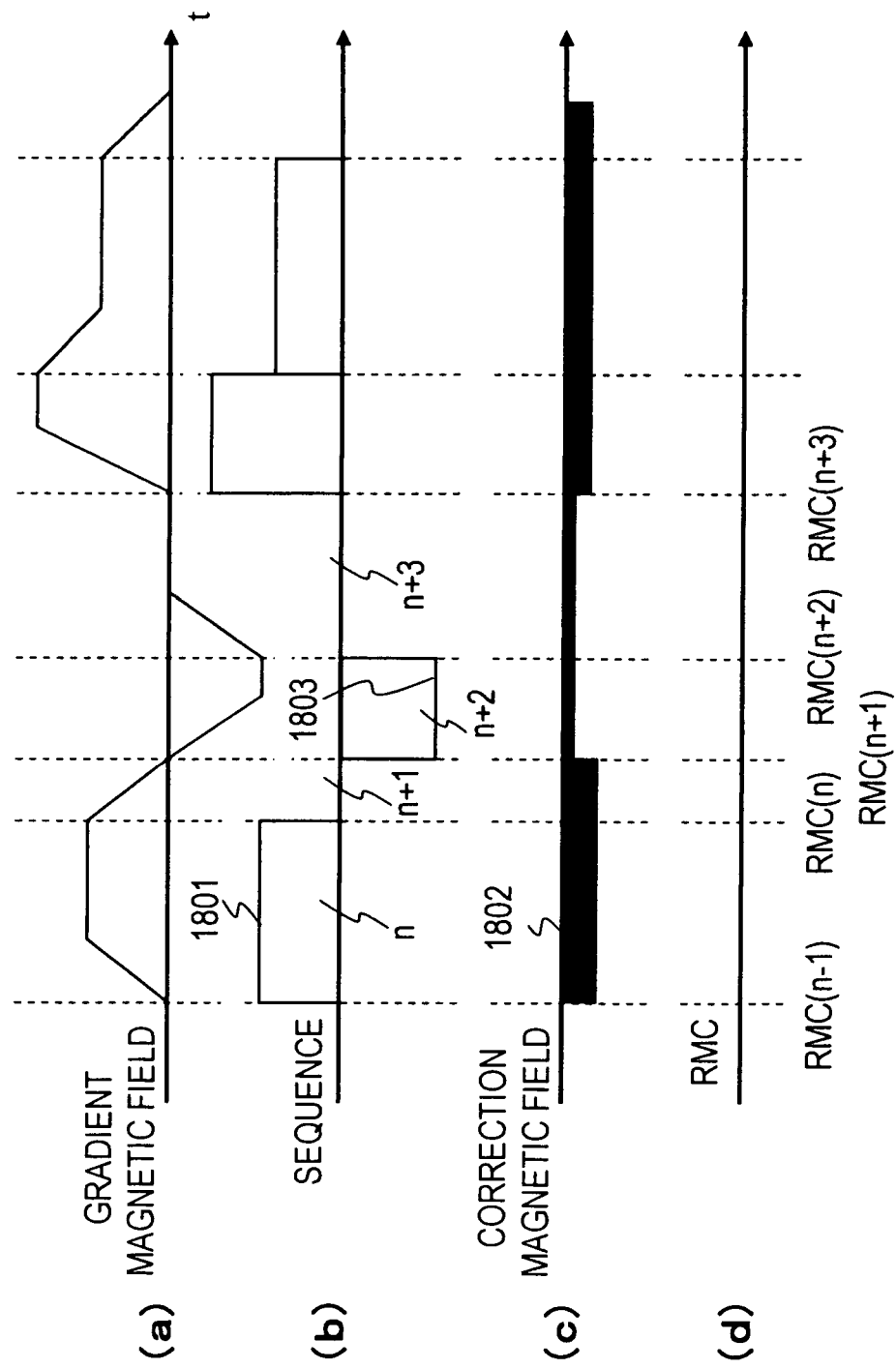
FIG. 19 is a diagram showing the embodiment for correcting the residual magnetic field in the case of executing the sequence including the application of a sequential (four in this embodiment) gradient magnetic field pulses.

FIG. 19 is a diagram illustrating the embodiment of the correction for the residual magnetic field in the case of executing the sequence including the sequential (four in this embodiment) application of the gradient magnetic field pulse. In the diagram, (b) represents the command for the application of the gradient magnetic field pulses from the sequencer, n~n+3 represents the applied four periods of the gradient magnetic field pulses that have different strength, and (a) represents the gradient magnetic field pulses that are actually applied. The reason that (a) is somewhat delayed corresponding to the command from (b) which is to apply the gradient magnetic field pulse is because an eddy current is generated in the structure upon application of the gradient magnetic field pulses. Also, (c) represents the correction magnetic field, and (d) represents the number of RM curves for the purpose of making reference for calculating the strength of the correction magnetic field.

First, when the n-th gradient magnetic field pulse 1801 apply command is initiated, the strength of the residual magnetic field being generated upon the application of the n-th gradient magnetic field pulse is obtained, using the newest RM curve RMC(n-1) being created according to the previous application history and the strength G(n) of the n-th gradient magnetic field pulse. Then the strength of the correction magnetic field for canceling this residual magnetic field is calculated, and correction magnetic field 1802 is applied with superposing over the application of gradient magnetic field pulse 1801. In parallel with this, the RM curve is updated so that gradient magnetic field 1801 is included in the application history. In other words, n-th gradient magnetic field pulse with G(n)-strength is inputted in step 1001 of FIG. 12, point P on its RMC(n-1) is obtained, then the residual magnetic field is obtained from its y-coordinate. In the case of updating the RM curve, it is updated using one of the above B~E processes according to the position of point P toward x-axis direction, and set as RMC(n).

Next, in period n+1, the applied correction magnetic field corresponding to strength G(n+1) of the gradient magnetic field pulse that is applied in period n+1 is calculated using RMC(n), and the RM curve RMC(n) is also updated. In the example shown in the diagram, since strength G(n+1) of the applied gradient magnetic field pulse in period of n+1 is zero, the correction magnetic field applied in period of n+1 is the same as the one in period of n, thus according to step 1003 of FIG. 12 RMC(n) would not be updated and turns out to be (RMC(n+1)=RMC(n)).

Next, when gradient magnetic pulse 1803 command is initiated in the period of n+2, the residual magnetic field being generated by the application of the gradient magnetic field pulse 1803 and the correction magnetic field to apply for canceling the residual magnetic field are calculated using this RMC(n+1) and the strength G(n+2) of the gradient magnetic field pulse 1803 in the period of n+2, and the correction magnetic field is applied with superposing over the gradient magnetic field pulse 1803. Subsequently in the same way, every time the gradient magnetic field pulse is applied, the application of the correction magnetic field using the newest RM curve and the update of the RM curve are executed.

In the present embodiment as described above, upon every application of the gradient magnetic field pulse, the correction magnetic field strength using the RM curve taking the application history until right before the application of the gradient magnetic field into consideration is obtained and applied, and the RM curve is updated including even the application of the gradient magnetic field pulse thereof in the application history. This enables the correction of the residual magnetic field that constantly reflects in real time the application history of the gradient magnetic field up to that time, and also enables the steady and precise correction of the residual magnetic field that expresses the anaclisis of complicated application history. Also in this embodiment, the application of the correction magnetic field is superposed over the application of the gradient magnetic field pulse, as contrast to applying it on a separate timing from the gradient magnetic field pulse, thus neither the prolongation nor the limitation would take place in the imaging sequence. Moreover, in this embodiment, it is possible to execute imaging sequences that are difficult to acquire satisfactorily because of the residual magnetic field and also the needed particular adjustments and corrections for the MRI apparatuses using conventional ferromagnetic materials such as a permanent magnet, and to acquire satisfactory results without particular adjustments or corrections. In concrete terms, since disarrangement of the CPMG train by the residual magnetic field can be restrained in implementing the Fast Spin Echo (FSE) method using CPMG train, the adjustments and the corrections specialized in the FSE method are no longer necessary. Also, in the diffusion weighted sequence that detects the diffusion of water using a quite large quantity of gradient magnetic field (MPG), it is possible to eliminate the residual magnetic field of MPG, which is a main cause of image deterioration, and improve the image quality. Furthermore, even in imaging that requires high uniformity of the static magnetic field such as RF fat restraint using a chemical shift, it is possible to restrain the deterioration of the static magnetic field uniformity caused by the residual magnetic field, and obtain clear fat restraint images even in the MRI apparatuses with permanent magnetic devices.

The present invention would not be limited to the above embodiment, and can be diversely transformed in a range that does not divagate the summary of the present invention.

For example, though the application axis of the gradient magnetic field pulse is not mentioned in the above embodiment, it is preferable for correcting the main components of the generated residual magnetic field to calculate RM curve corresponding to each of the gradient magnetic field of x, y, and z-axis and to apply the correction magnetic field to each of the axis using correction coil 27a. Furthermore, also for the components derived other than X, Y and Z-axis (for example, such as XY-axis and $Z^2$), it is possible to measure the RM curve in advance, maintain the measured RM curve in residual magnetic field correction device 25, and apply the correction magnetic field using correction coil 27b corresponding to the derived components. In this way correcting even the minute components of the generated residual magnetic field can be carried out.

Moreover, since the residual magnetic field response curves are varied depending on the application time or application numbers of the gradient magnetic field, these traits can be measured in advance, maintained in residual magnetic field correction device 25, and fine adjusted using factors corresponding to the application time or numbers of the gradient magnetic field.

Figure 20:
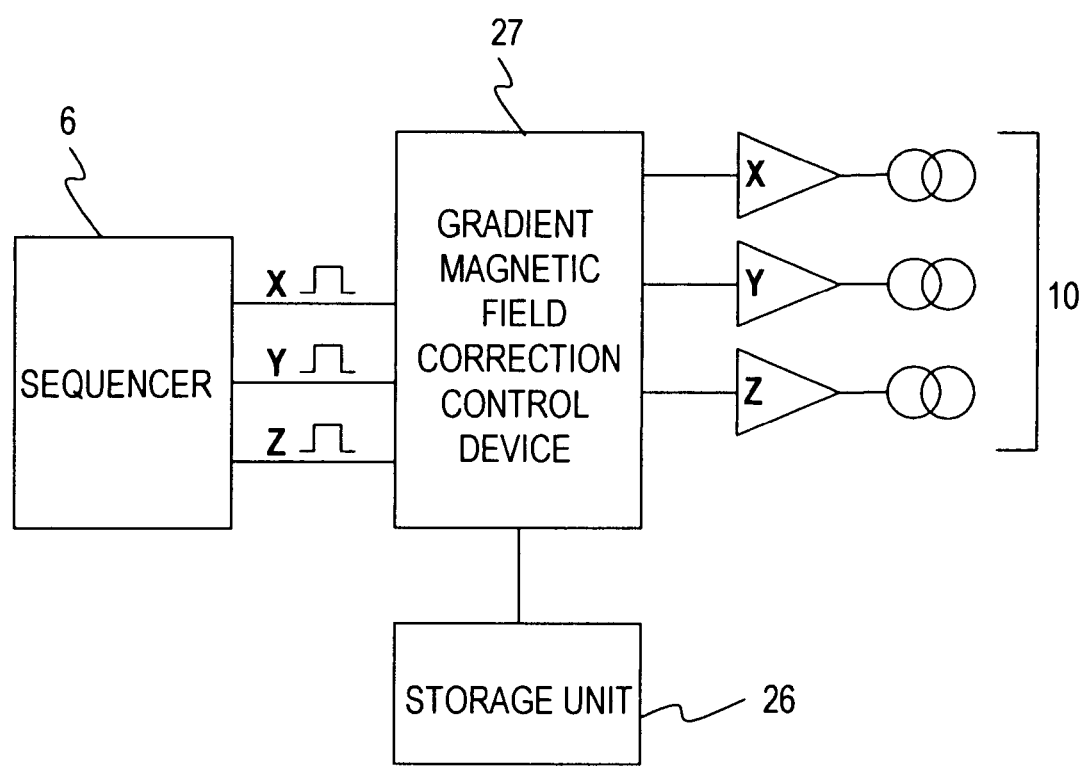
FIG. 20 is a configuration of the residual magnetic field correction means in the case of differentiating the strength of the gradient magnetic field pulses.

Though in the above embodiment the application of the correction magnetic field was mainly explained in the case of using the correction coils that are different from the gradient magnetic field coils, the present invention is not limited to this. Needless to say objects of the present invention that are to correct the residual magnetic field, taking into consideration the application history of the gradient magnetic field pulses, can also be achieved by adding the strength of the above-calculated correction magnetic field to the strength of the applied gradient magnetic field pulses and making fine adjustments, then applying it by differentiating the strength of the gradient magnetic field from the primary strength. In this case the configuration of the residual magnetic field correction means is, for example, as shown in FIG. 20, and it comprises gradient magnetic field correction control device 27 and storage unit 26, gradient magnetic field correction control device 27 is connected to sequencer 6, storage unit 26 is connected to gradient magnetic field correction control device 27, and gradient magnetic field correction control device 27 is connected to gradient magnetic field coil 10 via a gradient magnetic field power source (not shown in the diagram). When the information of the strength for the next gradient magnetic field pulse to be applied is transmitted, gradient magnetic field correction control device 27 calculates the strength of the residual magnetic field upon the application of the above-mentioned gradient magnetic field pulse using the residual magnetic field response function including the RM curve which took the application history of the previous gradient magnetic field pulses into consideration, and further calculates the strength of the gradient magnetic field pulse to be varied and applied for canceling said residual magnetic field. Then the controlling signals for applying the gradient magnetic field of which its changed strength is calculated is transmitted to the power source (not shown in the diagram) that activates the gradient magnetic field coil, and gradient magnetic field thereof is applied. At the same time, since the application history of the gradient magnetic field pulse is updated by the application of the gradient magnetic field pulse, the residual magnetic field response function including the RM curve is updated according to the predetermined factors as well, depending on the update of the mentioned application history. Afterwards, in the case of applying the gradient magnetic field pulses sequentially, the same procedure is to be performed on every application. With this sort of configuration, since the existing gradient magnetic field coils can be used for the correction of the residual magnetic field, it is possible to avoid manufacturing a more complex apparatus.

The invention claimed is:

1. A magnetic resonance imaging apparatus comprising:
   static magnetic field generation means for generating a static magnetic field in an imaging space where a subject is placed;
   gradient magnetic field generation means for applying a gradient magnetic field in said imaging space;
   high frequency magnetic field generation means for irradiating a high frequency magnetic field in said imaging space;
   reception means for detecting nuclear magnetic resonance signals generated from the subject;
   image reconstruction means for reconstructing images by using the nuclear magnetic resonance signals detected by the reception means;
   first control means for controlling the gradient magnetic field generation means and the high frequency magnetic field, in accordance with a pulse sequence;
   calculation means for calculating an intensity of a residual magnetic field generated by application of the gradient magnetic field on a basis of a residual magnetic field response function, which represents a relation between a strength of the applied gradient magnetic field and a strength of the residual magnetic field being generated by the application of the gradient magnetic field;
   correction means for correcting the residual magnetic field, based on the intensity calculated by the calculation means; and
   updating means for updating the residual magnetic field response function upon every application of the gradient magnetic field pulse,
   wherein the calculation means calculates the intensity of the residual magnetic field by using the residual magnetic field function updated upon said every application of the gradient magnetic field pulse, and
   the correction means corrects the residual magnetic field upon every application of the gradient magnetic field pulse.

2. The magnetic resonance imaging apparatus according to claim 1, wherein the residual magnetic field response function is calculated corresponding to each of x, y, and z-axis of the gradient magnetic field.

3. The magnetic resonance imaging apparatus according to claim 1, wherein the correction means comprises:
   residual magnetic field correction control means being connected to the first control means, for controlling correction by said correction means of the residual magnetic field;
   storage means connected to the residual magnetic field correction control means, for storing the residual magnetic field response function; and
   correction magnetic field generation means connected to the residual magnetic field correction control means, for applying a correction magnetic field to correct the residual magnetic field,
   wherein the residual magnetic field correction control means calculates the intensity of the residual magnetic field based on the residual magnetic field response function stored in the storage means, and transmits controlling signals for correcting the residual magnetic field to the correction magnetic field generation means.

4. The magnetic resonance imaging apparatus according to claim 3, wherein the correction magnetic field generation means corrects the residual magnetic field by applying the correction magnetic field having a same strength as, and a different polarity from, the residual magnetic field.

5. The magnetic resonance imaging apparatus according to claim 1, wherein the updating means updates a part of the residual magnetic field response function defined by said every application of the gradient magnetic field.

6. The magnetic resonance imaging apparatus according to claim 5, wherein the part of the residual magnetic field response function defined by every application of the gradient magnetic field pulse has a maximum absolute value in a direction of the applied gradient magnetic field which is the same strength as each of the applied gradient magnetic field pulse.

7. A magnetic resonance imaging method comprising the steps of:
(1) storing a residual magnetic field response function, which represents a relation between a strength of an applied gradient magnetic field and a strength of a residual magnetic field generated;
(2) irradiating one or more pulses of high frequency magnetic field;
(3) applying one or more pulses of gradient magnetic field;
(4) detecting nuclear magnetic resonance signals generated from a subject as a result of step (2) and step (3);
(5) calculating an intensity of the residual magnetic field generated by the application in the step (3) of the gradient magnetic field pulses, based on the residual magnetic field response function stored in step (1);
(6) correcting the residual magnetic field, based on the intensity calculated in the step (5); and
(7) updating the residual magnetic field response function stored in step (1), upon every application of the gradient magnetic field pulse in step (3),
wherein the intensity of the residual magnetic field is calculated in step (5) upon every application of the gradient magnetic field pulse based on the residual magnetic field response function updated in step (7) upon said every application of the gradient magnetic field pulse.

8. The magnetic resonance imaging method according to claim 7, wherein:
the residual magnetic field response function updated in step (7) is calculated corresponding to each of x, y and z-axis of the gradient magnetic field.

9. The magnetic resonance imaging method according to claim 7, wherein:
the updating in step (7) updates a part of the residual magnetic field response function defined by said every application of the gradient magnetic field.

10. A magnetic resonance imaging apparatus comprising:
a static magnetic field generation part configured to generate a static magnetic field in an imaging space where a subject is placed;
a gradient magnetic field generation part configured to apply a gradient magnetic field in said imaging space;
a high frequency magnetic field generation part configured to irradiate a high frequency magnetic field in said imaging space;
a first control part configured to control the gradient magnetic field generation part and the high frequency magnetic field generation part, in accordance with a pulse sequence;
a correction part configured to calculate an intensity of a residual magnetic field generated by application of the gradient magnetic field on a basis of a residual magnetic field response function representing a relation between a strength of the applied gradient magnetic field and a strength of the residual magnetic field being generated by the application of the gradient magnetic field, update the residual magnetic field response function upon every application of the gradient magnetic field pulse, and correct the residual magnetic field upon every application of the gradient magnetic field pulse.

11. The magnetic resonance imaging apparatus according to claim 10, wherein the residual magnetic field response function is calculated corresponding to each of x, y, and z-axis of the gradient magnetic field.

12. The magnetic resonance imaging apparatus according to claim 10, wherein the correction part comprises:
a residual magnetic field correction control part connected to the first control part and configured to control correction by said correction part of the residual magnetic field;
a storage part connected to the residual magnetic field correction control part and configured to store the residual magnetic field response function; and
a correction magnetic field generation part connected to the residual magnetic field correction control part and configured to apply a correction magnetic field to correct the residual magnetic field,
wherein the residual magnetic field correction control part calculates the intensity of the residual magnetic field based on the residual magnetic field response function stored in the storage part, and transmits controlling signals for correcting the residual magnetic field to the correction magnetic field generation part.

13. The magnetic resonance imaging apparatus according to claim 12, wherein the correction magnetic field generation part corrects the residual magnetic field by applying the correction magnetic field having a same strength as, and a different polarity from, the residual magnetic field.

14. The magnetic resonance imaging apparatus according to claim 10, wherein the correction part updates a part of the residual magnetic field response function defined by said every application of the gradient magnetic field.

15. The magnetic resonance imaging apparatus according to claim 14, wherein the part of the residual magnetic field response function defined by every application of the gradient magnetic field pulse has a maximum absolute value in a direction of the applied gradient magnetic field which is the same strength as each of the applied gradient magnetic field pulse.

* * * * *